United States Patent
Iizuka et al.

(10) Patent No.: US 7,391,053 B2
(45) Date of Patent: Jun. 24, 2008

(54) INSPECTION SUBSTRATE FOR DISPLAY DEVICE

(75) Inventors: Tetsuya Iizuka, Saitama (JP); Mitsuhiro Yamamoto, Fukaya (JP); Hiroshi Tabatake, Fukaya (JP)

(73) Assignee: Toshiba Matsushita Display Technology Co., Ltd., Tokyo (JP)

( * ) Notice: Subject to any disclaimer, the term of this patent is extended or adjusted under 35 U.S.C. 154(b) by 420 days.

(21) Appl. No.: 11/121,982

(22) Filed: May 5, 2005

(65) Prior Publication Data

US 2005/0263810 A1    Dec. 1, 2005

(30) Foreign Application Priority Data

May 28, 2004   (JP) ........................... P2004-158796
Dec. 16, 2004   (JP) ........................... P2004-364964

(51) Int. Cl.
*H01L 29/04*   (2006.01)
*H01L 29/15*   (2006.01)

(52) U.S. Cl. .............................. 257/59; 257/72; 349/43; 349/44; 349/100; 349/151; 349/152

(58) Field of Classification Search ............ 257/59, 257/72; 324/770; 349/43, 44, 100, 151, 349/152

See application file for complete search history.

(56) References Cited

U.S. PATENT DOCUMENTS 4,642,784 A   2/1987  White et al.
6,828,817 B2  12/2004 Fujita
6,897,932 B2 * 5/2005 Murade et al. ............... 349/151
7,061,553 B2 * 6/2006 Taguchi et al. ................ 349/39
2003/0075718 A1  4/2003 Jang et al.
2004/0222815 A1 11/2004 Kim et al.

FOREIGN PATENT DOCUMENTS

| JP | 11-145237 | 5/1999 |
| JP | 2002-350802 | 12/2002 |
| JP | 2003-233331 | 8/2003 |

* cited by examiner

*Primary Examiner*—Jerome Jackson
*Assistant Examiner*—Joseph Nguyen
(74) *Attorney, Agent, or Firm*—Oblon, Spivak, McClelland, Maier & Neustadt, P.C.

(57) ABSTRACT

In order to make it possible to easily detect an electrical defect by using an array tester, the present inspection substrate includes: plural scan lines and plural signal lines; plural storage capacitor lines arranged in parallel to the scan lines; storage capacitor elements, each of which uses a part of the storage capacitor line as one of electrodes thereof; storage capacitor upper electrodes formed of the same layer as that for the signal lines and electrically connected to the storage capacitor elements; switching elements arranged on intersection points of the signal lines and the scan lines and electrically connected to the storage capacitor elements; and dummy wiring lines formed by use of at least one of two types of metals constituting electrodes of the switching elements, and electrically connected to any of the scan lines, the signal lines, the storage capacitor lines and the storage capacitor upper electrodes.

6 Claims, 15 Drawing Sheets

FIG.7
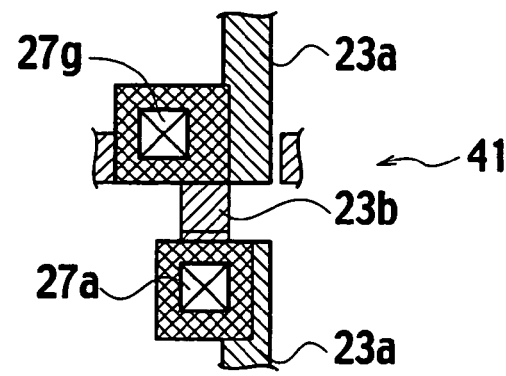
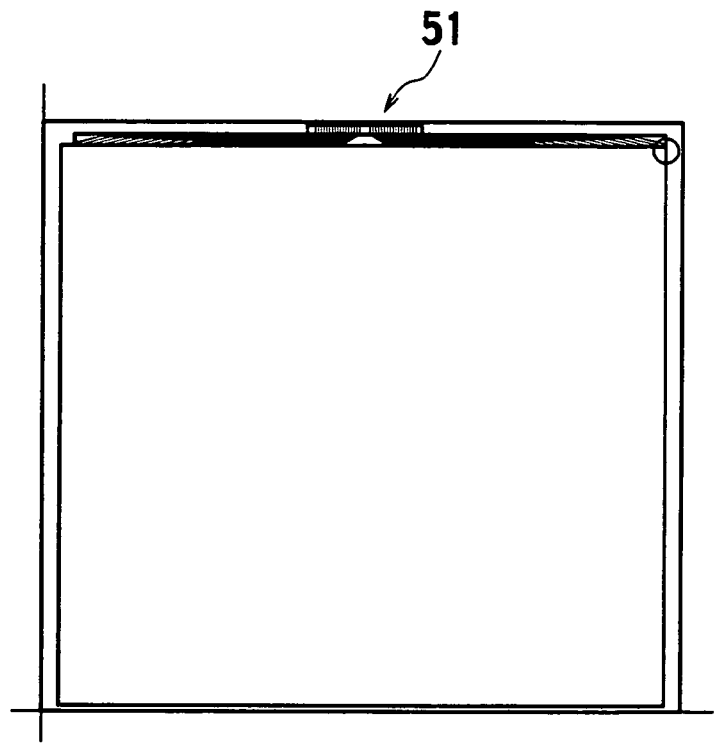
FIG.8A
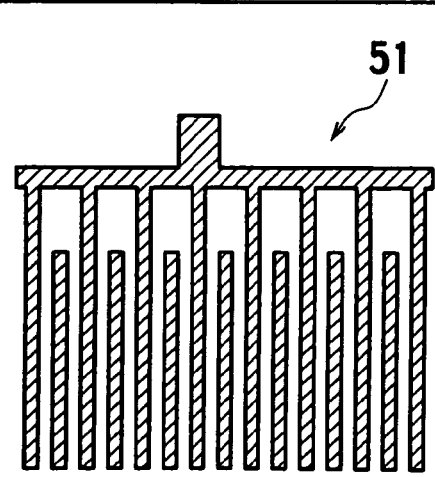
FIG.8B

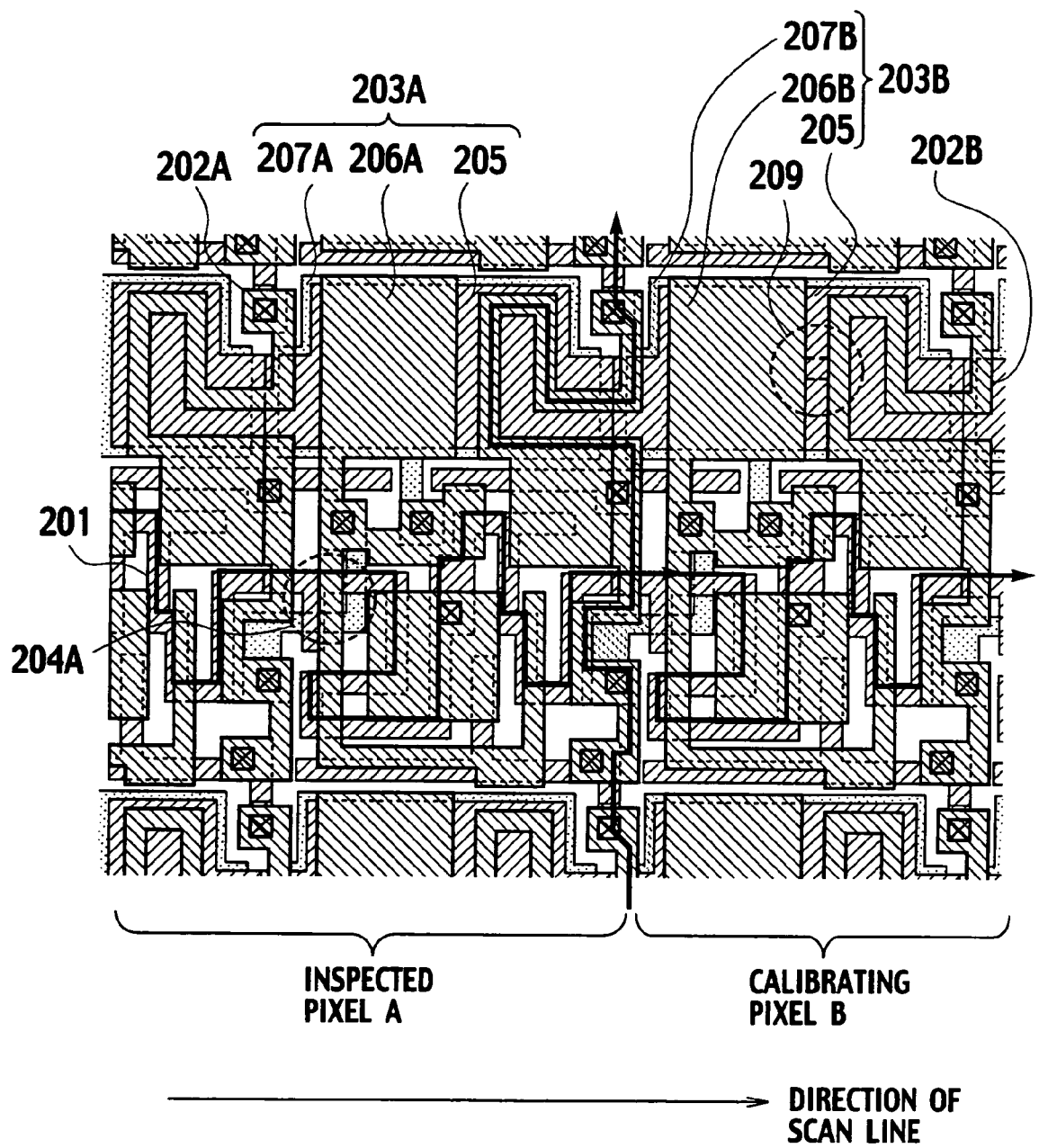

INSPECTION SUBSTRATE FOR DISPLAY DEVICE

CROSS-REFERENCE TO RELATED APPLICATIONS

This application is based upon and claims the benefit of priority from Japanese Patent Applications No. 2004-158796 filed on May 28, 2004 and No. 2004-364964 filed on Dec. 16, 2004; the entire contents of which are incorporated herein by reference.

BACKGROUND OF THE INVENTION

1. Field of the Invention

The present invention relates to an inspection substrate to be used for detecting a wiring defect, a failure spot and the like in an array substrate of a display device.

2. Description of the Related Art

In recent years, commercialization of a high-function liquid crystal display device capable of high-definition display though being high-density and large-capacity has progressed. Among such liquid crystal display devices, one of an active matrix type has been frequently used. The active matrix type liquid crystal display device includes an array substrate, in which each of regions individually partitioned by plural scan lines and plural signal lines which intersect each other is defined as a pixel, and a switching element, a pixel electrode and the like are arranged for each pixel. In the active matrix type liquid crystal display device, a crosstalk between adjacent pixels is small, high-contrast display is obtained, transmission display is enabled, and area enlargement thereof is also easy.

In the active matrix type liquid crystal display device, as definition thereof has been increased, microprocessing for wiring lines and contact holes has become necessary, and it has been required to keep a high process level. Therefore, in recent years, a process level chip (hereinafter, referred to as a "PL chip") in which only the wiring lines in the array substrate are provided has been manufactured, and a state of the wiring lines in the PL chip has been electrically measured by means of a tester, or optically evaluated by means of a defect inspection apparatus. Moreover, also for the actual array substrate, an electrical defect thereof is inspected by use of an array tester, a failure thereof is analyzed, and a management and improvement of the process level are achieved.

However, according to the above-described method, there are problems that the defect detected in the PL chip does not always coincide with the defect in the array substrate, and that one regarded as the defect in the array substrate is not detected in the PL chip.

Moreover, according to the above-described method, the defect detectable in the PL chip is limited only to defects in which abnormalities are observed on a planer wiring pattern and an exterior appearance. Therefore, there is a problem that an evaluation for the array substrate must be concurrently used for characteristics as a device, which include characteristics of the switching elements and the contact holes.

Furthermore, also in the case of inspecting the array substrate by means of the array tester, a defect detection capability thereof is insufficient, and a position where the defect occurs cannot be specified in some cases depending on a type of the defect. Therefore, there is a problem that the management and improvement of the process level cannot be performed sufficiently.

This point is described with reference to FIG. 1 and FIG. 2. FIG. 1 is a plan view showing an example of a wiring pattern in the PL chip. FIG. 2 is a plan view showing a wiring pattern with a contact chain structure.

In FIG. 1, a meandering wiring line 181 is formed of a metal film, and to both ends of the meandering wiring line 181, electrode pads 183a and 183b are individually connected. In order to detect a break of the meandering wiring line 181, a voltage is applied between both of the electrode pads 183a and 183b, and it is monitored whether or not a current flows therethrough. When the current does not flow, the break occurs in the meandering wiring line 181.

In FIG. 2, a meandering wiring line 191 is formed with the contact chain structure, in which plural ones formed by alternately arranging first metals 193 and second metals 195 and electrically connecting ends of the respective metals to one another by contact holes 197 are arranged. To both ends of the contact chain structure, electrode pads 199a and 199b are connected. In order to detect a break of the meandering wiring 191, a voltage is applied between both of the electrode pads 199a and 199b, and it is monitored whether or not a current flows therethrough. When the current does not flow, the break occurs in the meandering wiring 191.

However, in both of the cases, for example, when abnormalities are not observed on exterior appearances of the wiring lines, a position where the break occurs cannot be specified.

Moreover, in recent years, used has been a method for managing an occurrence rate of the defect and a state of the malfunction in a manufacturing line in such a manner that a process level chip in which only various lines and spaces (L/S) are arranged for the inspection is fabricated in the manufacturing line, and that the process level chip is electrically measured by means of the tester or optically evaluated by means of the defect inspection apparatus.

In the electrical defect inspection using the array tester, an actual array substrate is used as the inspection substrate, and the respective inspection pins of the array tester are connected to the respective signal lines on the array substrate, thus performing the measurement. In the measurement, the switching elements of the respective pixels on the array substrate are switched on, and thereafter, charges are stored in the storage capacitors of the respective pixels through the respective signal lines, and the amount of stored charges is measured through the inspection pins of the array tester. By performing defect analysis for an obtained measurement result, a leakage defect of the amount of charges stored in the storage capacitors of the respective pixels, characteristic abnormalities of the switching elements, short circuit/break defect of the wiring lines, and the like are detected. Based on a result of the detection, the process level of the manufacturing line is managed and improved.

However, in the detection result by means of the array tester, the smaller the storage capacitor to be inspected is, the larger an influence of noise owing to parasitic capacitance becomes in terms of the configuration of the array tester concerned. In general, the influence from the parasitic capacitance becomes larger as the storage capacitor is moved away from a feeding end of each signal line, and accordingly, an output result is outputted in a state where a gradation is applied thereto in the direction of the signal lines. Moreover, approximately 200 signal lines are processed simultaneously in usual, and there is a problem that the output result is outputted as streak unevenness between the signal lines owing to variations in sensitivity for the input signals of the respective inspection pins of the array tester.

Moreover, there is a problem that the process level chip cannot be accurately evaluated because, owing to the influence from the parasitic capacitance of each signal line and the variations in sensitivity for the input signals of the respective inspection pins of the array tester, an abnormal pixel is not sometimes detected even if there are abnormalities in the characteristics of the switching elements of the pixels.

Meanwhile, in the inspection of the defect by means of the array tester, only the electrical characteristics of the respective pixels can be measured. Accordingly, in order to specify a kind of the defect such as to whether the detected defect is a short-circuit defect or a break defect, it is necessary to use a pattern inspection by means of an optical appearance inspection apparatus in combination.

SUMMARY OF THE INVENTION

It is an object of the present invention to provide an inspection substrate for a display device, which is capable of easily detecting the electrical defect.

It is another object of the present invention to provide an inspection substrate capable of supplying inspection data for correcting the detection result of the array tester, which is affected by the parasitic capacitance of each signal line and the variations in sensitivity for the input signals of the respective inspection pins.

It is still another object of the present invention to provide an inspection substrate capable of supplying inspection data for detecting an abnormal pixel in the characteristics of the switching element irrespective of the influence from the parasitic capacitance of each signal line or the variations in sensitivity for the input signals of the respective inspection pins.

It is yet another object of the present invention to provide an inspection substrate capable of supplying inspection data for surely detecting the defect such as a short circuit and a break irrespective of the influence from the parasitic capacitance of each signal line or the variations in sensitivity for the input signals of the respective inspection pins.

A feature of an inspection substrate for a display device according to a first invention is in that the inspection substrate includes: plural scan lines and plural signal lines, which are arranged so as to intersect each other; plural storage capacitor lines arrayed with the scan lines; storage capacitor elements, each of which uses a part of the storage capacitor line as one of electrodes thereof; storage capacitor upper electrodes formed of the same layer as that for the signal lines and electrically connected to the storage capacitor elements; switching elements arranged on intersection points of the signal lines and the scan lines and electrically connected to the storage capacitor elements; and dummy wiring lines formed by use of at least one of two types of metals constituting electrodes of the switching elements, and electrically connected to any of the scan lines, the storage capacitor lines, the signal lines and the storage capacitor upper electrodes.

According to this invention, the plural scan lines, signal lines, storage capacitor lines, storage capacitor elements, storage capacitor upper electrodes, switching elements and dummy wiring lines are provided on the inspection substrate, and the dummy wiring lines are electrically connected to any of the scan lines, the signal lines, the storage capacitor lines and the storage capacitor upper electrodes. In such a way, a probability of occurrence of a short circuit between the respective wiring lines in the inspection substrate can be increased, and the short circuit of the wiring lines can be easily detected by measuring voltages of the dummy wiring lines by means of an array tester.

Hence, in which portion or in which wiring line the failure relating to the short circuit is prone to occur can be anticipated based on the occurred failure relating to the short circuit. Performance of the process can be grasped based on a result of the anticipation, and in addition, feedback of the result is made to a manufacturing line, thus making it possible to increase yield of the products. Specifically, a function to check a process level can be concurrently provided to the inspection substrate, and the device characteristics and the process level can be evaluated simultaneously by use of the array tester.

A feature of a second invention is in that a wired region formed of the signal lines, the scan lines, the storage capacitor lines, the storage capacitor upper electrodes, the switching elements, and the dummy wiring lines, is formed larger than a non-wired region where any of the wiring lines does not exist. In such a way, a wiring density can be made high, the probability of occurrence of the short circuit between the respective wiring lines can be increased, and the short circuit can be easily detected by means of the array tester.

A feature of a third invention is in that the dummy wiring lines formed of the same metal layer as that for the scan lines and the storage capacitor lines are arranged between the storage capacitor lines and scan lines formed by extending lower electrodes using one of the two types of metals constituting the switching elements. According to this invention, a short circuit between the scan lines and the storage capacitor lines can be easily inspected by measuring the voltages of the dummy wirings.

A feature of a fourth invention according to the third invention is in that the dummy wiring lines are electrically connected to the signal lines. In such a way, the dummy wirings are provided by the same wiring layer as that for the scan lines and the storage capacitor lines between the scan lines and the storage capacitor lines, and in addition, the dummy wiring lines are connected to the signal lines. Hence, by measuring the voltages of the dummy wirings, the short circuit between the scan lines and the storage capacitor lines can be inspected, and a spot of the short circuit can be specified. Specifically, when the short circuit occurs between the scan lines and the storage capacitor lines arranged in parallel to the scan lines, by means of the array tester, in which portion of the wiring lines the short circuit occurs cannot be determined though the short circuit can be detected simply as a line defect. As opposed to this, according to this invention, the dummy wiring lines formed of the same metal layer as that for the scan lines and the storage capacitor lines are connected to the signal lines. Accordingly, the short circuit between the scan lines and the storage capacitor lines becomes a cross short circuit through the dummy wiring lines and the signal lines, and the spot where the short circuit has occurred can be specified based on a position of the signal line concerned.

A feature of a fifth invention according to the third invention is in that the inspection substrate further includes: signal lines formed by extending upper electrodes using one of the two types of metals constituting the switching elements; and dummy wirings formed by extending the storage capacitor upper electrodes, wherein the signal lines, the dummy wiring lines and the storage capacitor upper electrodes are arranged adjacent to one another. In such a way, the wiring density is increased, and the short circuit is prone to occur in the same layer. Hence, the short circuit can be easily detected by means of the array tester, and in which portion or in which wiring line the failure relating to the short circuit is prone to occur can be anticipated based on the occurred failure relating to the short circuit.

A feature of a sixth invention according to the third invention is in that the inspection substrate further includes: signal lines formed by extending upper electrodes of the switching elements; dummy wiring lines formed by extending the storage capacitor upper electrodes; and dummy electrodes, wherein the signal lines, the dummy wiring lines, the dummy electrodes and the storage capacitor upper electrodes are arranged adjacent to one another. A short circuit between the storage capacitor upper electrodes and the upper electrodes of the switching elements in the same layer can be inspected by measuring voltages of the dummy wirings and the dummy electrodes.

A feature of a seventh invention according to the sixth invention is in that the dummy electrodes are electrically connected to the scan lines. In such a way, a spot of the short circuit in the scan lines can be specified.

A feature of an eight invention according to the seventh invention is in that sizes of the dummy electrodes and the storage capacitor upper electrodes are predetermined sizes or more, and a region with a predetermined width or more is provided in a part of the signal lines, for being used to be as contact pads. In such a way, the dummy electrodes, the storage capacitor upper electrodes and the scan lines can be used as contact pads for receiving a probe of the array tester or the like, and the short circuit can be inspected accurately and efficiently by means of the array tester and the like.

A feature of an inspection substrate for a display device according to a ninth invention is in that the inspection substrate includes: plural scan lines and plural signal lines, which are arranged so as to intersect each other; plural storage capacitor lines arranged in parallel to the scan lines; storage capacitor elements, each of which uses a part of the storage capacitor line as one of electrodes thereof; storage capacitor upper electrodes formed of the same layer as that for the signal lines and electrically connected to the storage capacitor elements; and switching elements arranged on intersection points of the signal lines and the scan lines and electrically connected to the storage capacitor elements, wherein at least one of the signal lines and the scan lines meanders.

According to this invention, at least one of the scan lines and the signal lines meanders. Accordingly, wiring length of at least one of the scan lines and the signal lines is elongated, and a probability of occurrence of a break (open) thereof is increased. In which portion or in which wiring line such a break failure is prone to occur can be anticipated by measuring the occurred failure relating to the open by means of the array tester.

A feature of a tenth invention according to the ninth invention is in that the signal lines meander on the storage capacitor lines. In general, when a layer and a wiring line such as the storage capacitor lines are present under a wiring line, the wiring line concerned tends to be thinned more than when these layer and wiring line are not present. In this invention, the signal lines are made to meander on the storage capacitor lines, and thus, to which extent the signal lines are thinned can be confirmed. In addition, an extent to which the signal lines are thinned, which causes the break, can be confirmed.

A feature of an eleventh invention is in that the inspection substrate further includes: a contact chain structure, in which at least one of the signal lines and the scan lines is composed by alternately arranging two types of metals constituting electrodes of the switching elements, and ends of the signal lines and the scan lines are electrically connected to one another through contact holes.

According to this invention, a probability of occurrence of a defect of the contact holes can be confirmed by the contact chain structure. Moreover, for the contact chain structure, for example, a break of the contact holes can be detected by means of the array tester. Furthermore, in which portion the break has occurred in the contact holes can be detected based on an exterior appearance of each contact hole. Meanwhile, when abnormalities are not observed on the exterior appearance of the contact hole, in which portion the break has occurred can be specified based on a position of the corresponding signal line.

A feature of a twelfth invention is in that the predetermined sizes of the dummy electrodes and the storage capacitor upper electrodes are 10 µm or more in terms of side lengths thereof, and the predetermined width of a part of the signal lines is 10 µm or more.

A feature of an inspection substrate for a display device according to a thirteenth invention is in that the inspection substrate includes: an inspected pixel including a storage capacitor element and a switching element electrically connected to the storage capacitor element, the inspected pixel being arranged on each intersection point of plural scan lines and plural signal lines, which are wired to intersect each other; and a calibrating pixel including a storage capacitor element having a larger storage capacity than the storage capacitor element of the inspected pixel, the calibrating pixel being arranged, in at least one of the signal lines, on at least one of a feeding end and non-feeding end of the signal line.

According to this invention, the calibrating pixel is arranged on the feeding end or non-feeding end of the signal line, and the storage capacity of the calibrating pixel is made larger than the storage capacity of the inspected pixel, thus making it possible to enhance detection sensitivity when the array tester detects a charge stored in the storage capacitor. In such a way, for example, the array tester compares inspection data of the calibrating pixels between the signal lines, thus making it possible to obtain data for correcting the output result of the array tester, which is affected by the variations in sensitivity for the input signals of the respective inspection pins of the array tester.

A feature of a fourteenth invention is in that calibrating pixels having the same configuration are provided, in at least one of the signal lines, on both of the feeding-end side and non-feeding-end side of the signal line.

According to this invention, the calibrating pixels having the same configuration are arranged on the feeding end and non-feeding end of the signal line. Thus, the array tester compares inspection data of the two calibrating pixels having the same configuration in the same signal line with each other, thus making it possible to obtain data for correcting the output result of the inspected pixel, which is affected by parasitic capacitance in the direction of the signal line.

A feature of an inspection substrate for a display device according to a fifteenth invention is in that the inspection substrate includes: an inspected pixel including a storage capacitor element and a switching element electrically connected to the storage capacitor element, the inspected pixel being arranged on each intersection point of plural scan lines and plural signal lines, which are wired to intersect each other; and a calibrating pixel including a switching element different in characteristics from the switching element of the inspected pixel.

According to this invention, the calibrating pixel having the electrical characteristics of the switching element, which are different from the electrical characteristics of the inspected pixel, is provided. Thus, for example, as a result of comparing inspection data of the calibrating pixel and the detection result of the inspected pixel located in the vicinity of the calibrating pixel with each other, if the inspection data and the detection result exhibit similar electrical characteristics, then the array tester can determine that the inspected pixel is abnormal in characteristics and that the switching element thereof is abnormal.

A feature of a sixteenth invention is in that the calibrating pixel includes a switching element different in at least one of channel width and channel length from the switching element of the inspected pixel.

According to this invention, the calibrating pixel including the switching element different in channel width or channel length is provided, and thus the calibrating pixel has electrical characteristics of the switching element, which are different from the electrical characteristics of the inspected pixel.

A feature of an inspection substrate for a display device according to a seventeenth invention is in that the inspection substrate includes: an inspected pixel including a storage capacitor element having a storage capacitor line wired between an upper electrode and a lower electrode, and a switching element electrically connected to the storage capacitor element, the inspection pixel being arranged on each intersection point of plural scan lines and plural signal lines, which are wired to intersect each other; and a calibrating pixel having a defect prepared in advance in a part thereof.

According to this invention, the calibrating pixel including the defect is provided. Thus, the calibrating pixel has electrical characteristics different from the electrical characteristics of the inspected pixel. Therefore, as a result of comparing the inspection data of the calibrating pixel including the short-circuit defect and the detection result of the inspected pixel with each other, if characteristics of both are substantially equal to each other, then the array tester can determine that the inspected pixel concerned has the short-circuit defect.

A feature of an eighteenth invention is in that the defect is prepared by short-circuiting at least two of the scan line, the signal line, the storage capacitor line, and the upper electrode.

A feature of a nineteenth invention is in that the defect is prepared by breaking at least one of the scan line and the storage capacitor line.

BRIEF DESCRIPTION OF THE DRAWINGS

FIG. 7 shows an enlarged view of a contact chain structure in FIG. 6.

FIG. 8A shows a position of a pad for detecting a break in the PL chip, and FIG. 8B shows an enlarged view of the pad.

FIG. 17 is an enlarged view of an inspected pixel and a calibrating pixel, which are arranged along a direction of a scan line within one chip of an active matrix type inspection substrate according to a sixth embodiment.

DESCRIPTION OF THE EMBODIMENT

First Embodiment

Figure 3:
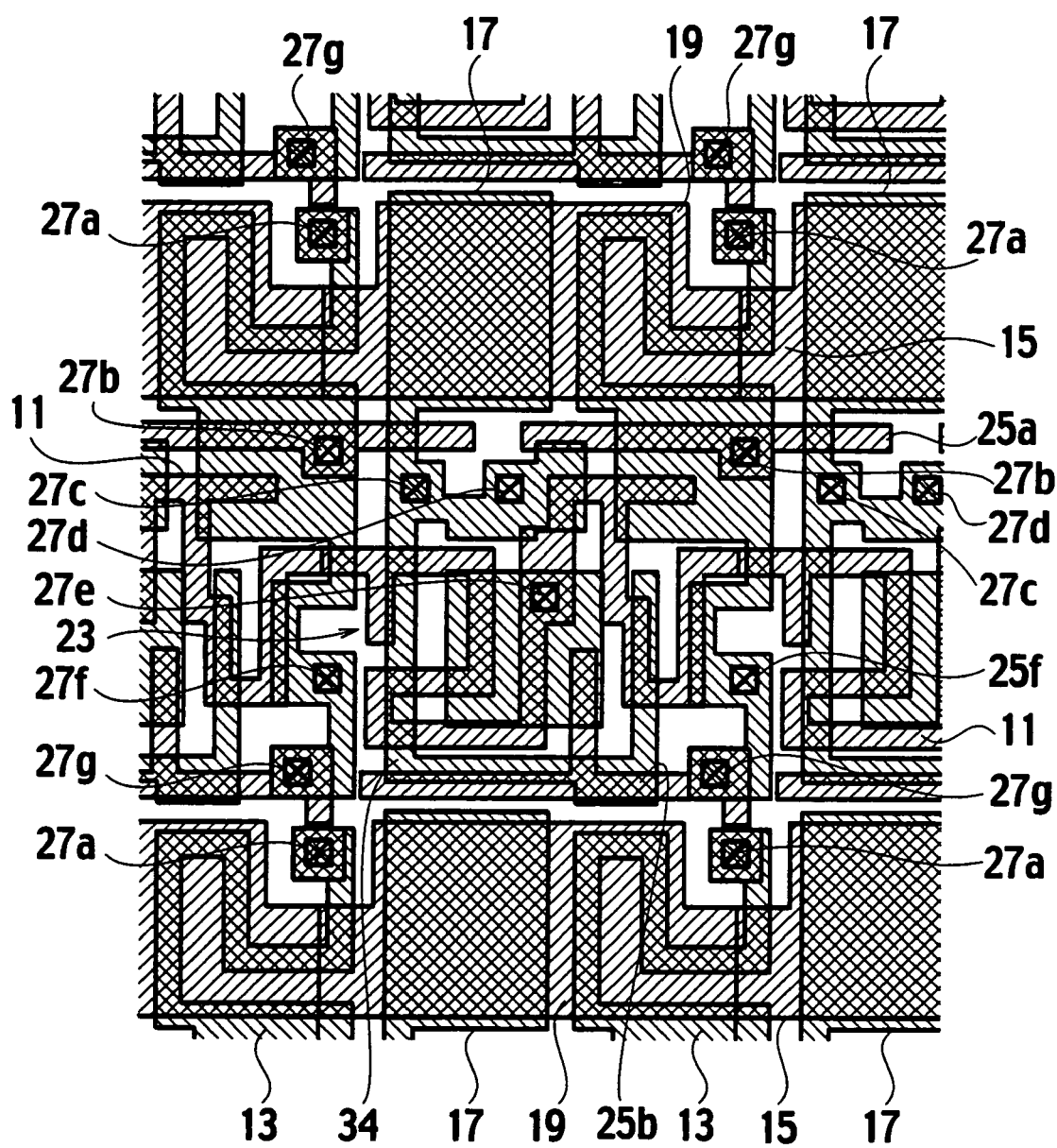
FIG. 3 shows a plan view of an inspection substrate for a display device in first and second embodiments.

As shown in a plan view of FIG. 3, an inspection substrate for a display device in a first embodiment is manufactured on a glass substrate having the same material composition as that of an array substrate actually used in the liquid crystal display device in the same manufacturing process as that for the actual array substrate so as to have electric characteristics equivalent thereto. As various wiring lines provided on the inspection substrate, besides wiring lines such as scan lines and signal lines existing on the actual array substrate, additionally provided are: a wiring line with a special pattern in which a probability of occurrence of a failure such as a short circuit and a break (open) is increased for the purpose of verifying where the failure is prone to occur during the manufacture; a wiring line in which contact holes are electrically connected thereto for the purpose of specifying a failure spot; and the like. For example, a dummy wiring line or a meandering wiring line is used as the wiring line with the special pattern. It is not necessary that, in this inspection substrate, a size and shape thereof be the same as those of the actual array substrate, and the size and the shape are changeable as appropriate so as to fit to an inspection.

Figure 4:
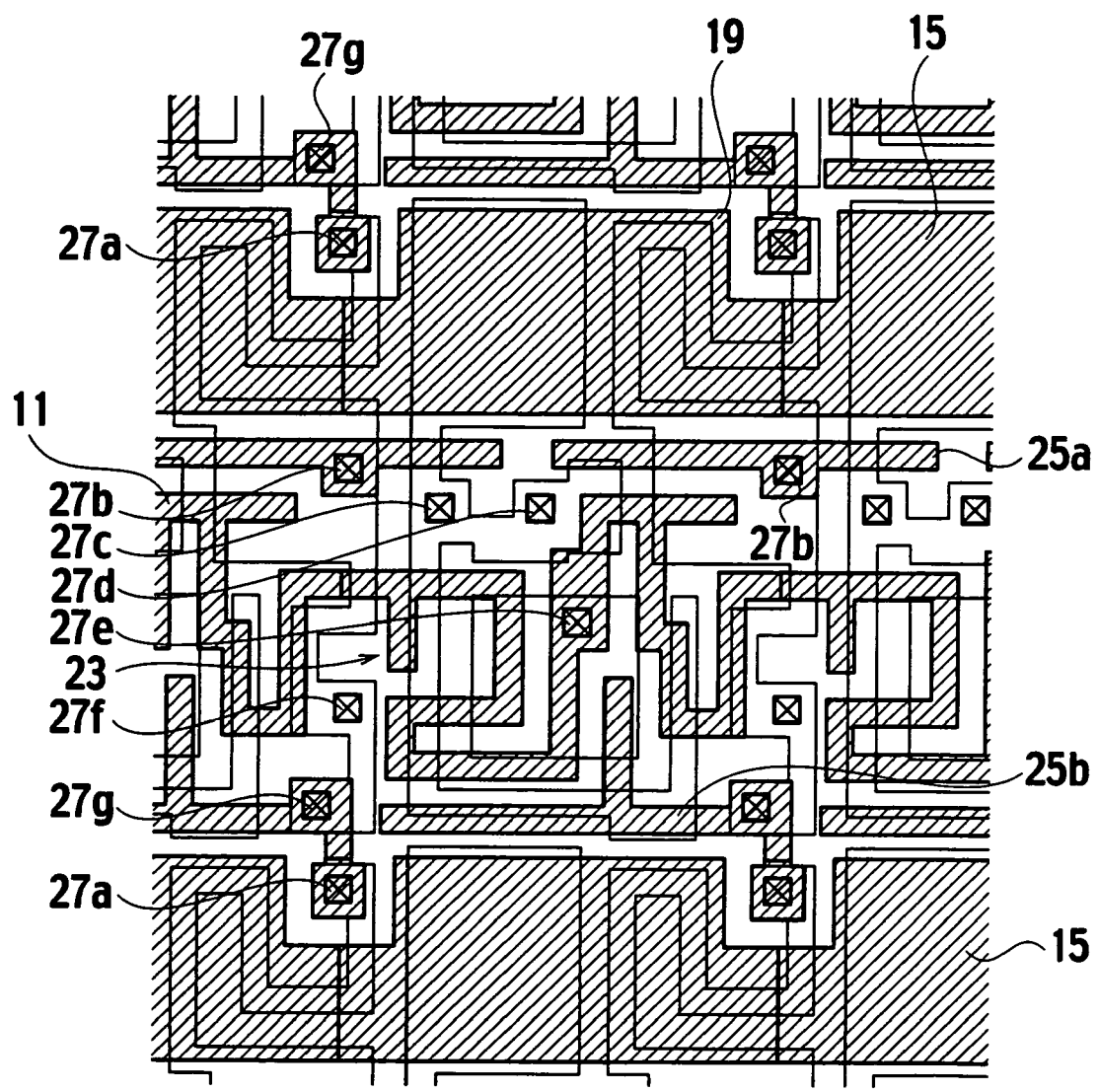
FIG. 4 shows a plan view where only wiring lines such as scan lines and storage capacitor lines which run in a horizontal direction are taken out of a large number of wiring lines in FIG. 3.
Figure 5:
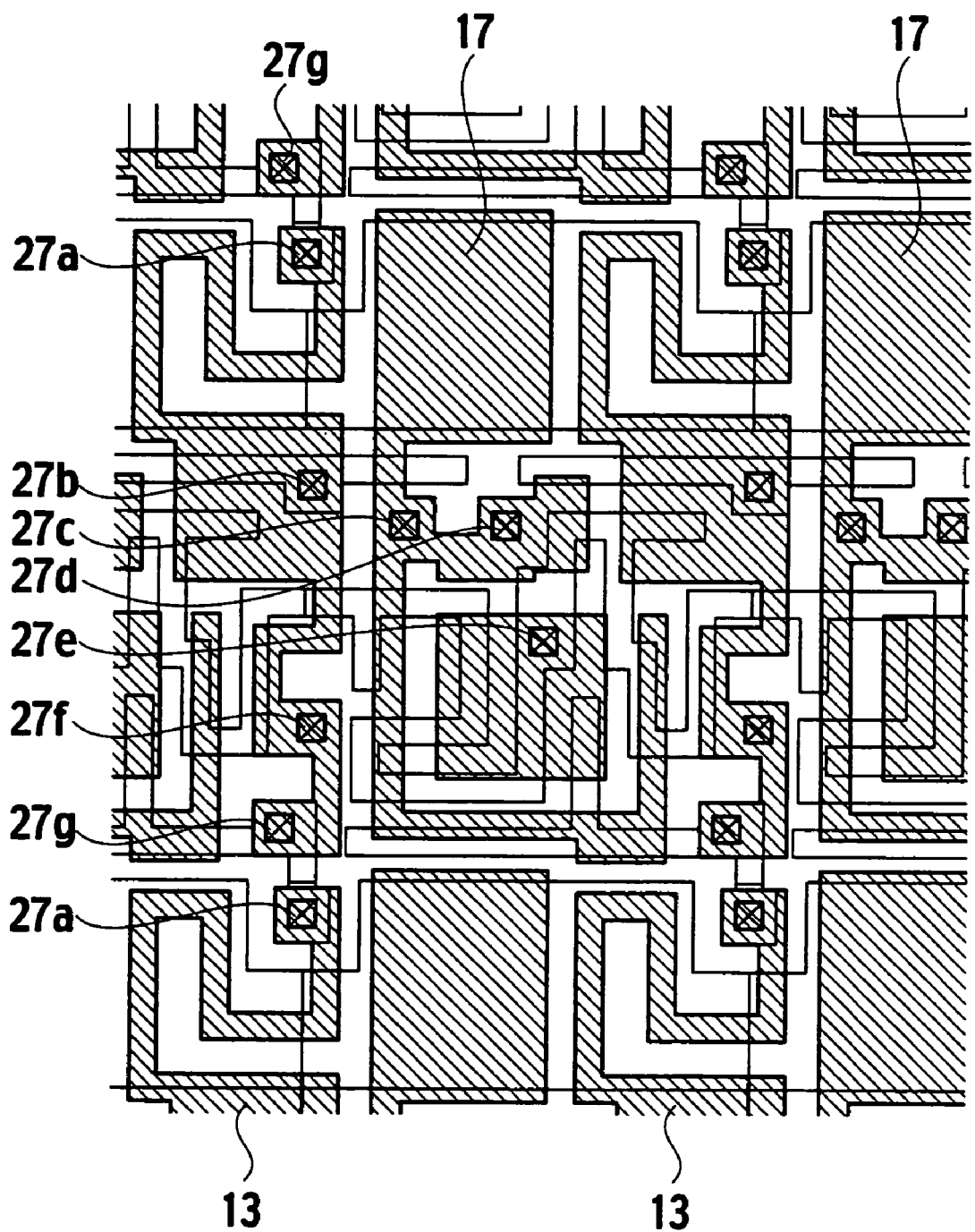
FIG. 5 shows a plan view where only wiring lines such as scan lines and storage capacitor upper electrodes which run in a vertical direction are taken out of the large number of wiring lines in FIG. 3.

FIG. 4 is a view plainly showing only wiring lines such as scan lines and storage capacitor lines running in a lateral direction in FIG. 3, which are taken out of the large number of wiring lines in the inspection substrate of FIG. 3. FIG. 5 is a view plainly showing only wiring lines such as signal lines and storage capacitor upper electrodes running in a longitudinal direction in FIG. 3, which are taken out of the large number of wiring lines in the inspection substrate of FIG. 3. Note that square boxes in FIG. 3, where cross symbols or slash symbols are written, represent contact holes 27a to 27g having a size in which each side is several millimeters long.

Next, the various wiring lines in the inspection substrate of this embodiment are described with reference to FIG. 3, FIG. 4 and FIG. 5. In this inspection substrate, plural scan lines 11 are arrayed while meandering individually. Plural signal lines 13 are arrayed while meandering individually so as to intersect the plural scan lines 11. Moreover, plural storage capacitor lines 15 are arrayed individually for the plural scan lines 11.

For the respective signal lines 13, plural storage capacitor upper electrodes 17 are arrayed in the same layer as that for the respective signal lines 13. Moreover, storage capacitor elements 21 are provided, each of which is formed of the storage capacitor upper electrode 17 and an storage capacitor lower electrode 19 as a part of the storage capacitor line 15. A switching element 23 is provided on each intersection point of the scan lines 11 and the signal lines 13. The switching element 23 is a thin-film transistor (TFT) using a polysilicon layer of a P-channel type, and electrically connected to the storage capacitor element 21 through the contact holes 27c and 27d.

In a region other than a region where the scan lines 11, the signal lines 13, the storage capacitor lines 15, the storage capacitor upper electrodes 17, the storage capacitor lower electrodes 19, the storage capacitor elements 21 and the switching elements 23 are provided, dummy wiring lines 25a and 25b are provided. The dummy wiring lines 25a and 25b are formed by use of at least one of two types of metals constituting electrodes of each switching element 23. The two types of metals are metal of a gate electrode and metal of a source electrode and a drain electrode. The dummy wiring lines 25a and 25b are electrically connected to any of the scan lines 11, the signal lines 13, the storage capacitor lines 15 and the storage capacitor upper electrodes 17 through the contact holes 27a to 27g.

More specifically, the dummy wiring line 25a is electrically connected to the signal line 13 through the contact hole 27b, and the dummy wiring line 25b is electrically connected to the signal line 13 through the contact holes 27g and 27a.

Moreover, in the inspection substrate, a wired region formed of the scan lines 11, the signal lines 13, the storage capacitor lines 15, the storage capacitor upper electrodes 17, and the dummy wiring lines 25a and 25b, is formed larger than a non-wired region where any of the wiring lines does not exist.

As described above, in the first embodiment, as in the actual array substrate, the scan lines 11, the signal lines 13, the storage capacitor lines 15, the storage capacitor upper electrodes 17, the storage capacitor lower electrodes 19, the storage capacitor elements 21, and the switching elements 23, are provided in the inspection substrate. The dummy wiring lines 25a and 25b are provided in the region other than the region where the above-described wiring lines and the like are provided, and are electrically connected to any of the storage capacitor lines 15 and the storage capacitor upper electrodes 17. In such a way, a probability of occurrence of the short circuit between the respective wiring lines in the inspection substrate is increased, and the short circuit of the wiring lines can be easily detected by measuring voltages of the dummy wiring lines by means of an array tester.

Moreover, the adjacent wiring lines are connected to wiring lines where potentials are different from each other. In addition, the wired region formed of the scan lines 11, the signal lines 13, the storage capacitor lines 15, the storage capacitor upper electrodes 17, the switching elements 23, and the dummy wiring lines 25, is formed larger than the non-wired region where any of the wiring lines does not exist. Thus, the probability of occurrence of the short circuit can be further increased.

In such a way, in which portion or in which wiring line the failure relating to the short circuit is prone to occur can be anticipated based on the occurred failure relating to the short circuit. Performance of the process can be grasped based on a result of the anticipation, and in addition, feedback of the result is made to a manufacturing line, thus making it possible to reduce occurrence of defective items.

As described above, a function to check a process level can be concurrently provided to the inspection substrate, and the device characteristics and the process level can be evaluated simultaneously by use of the array tester. For example, under the same condition as in actually displaying an image on the liquid crystal display device, the switching elements 23 in the inspection substrate are switched on, thus charging portions corresponding to the pixels with electric charges through the signal lines. Subsequently, the switching elements 23 are switched off, and the pixels are opened once. Then, the switching elements 23 are switched on one more time, and it is monitored how potentials of the signal lines 13 are varied by an amount of the charges previously charged. Subsequently, potentials are checked for all of the pixels, and thus it is determined that a pixel in which the potential is higher or lower than a normal potential of the pixel has a leakage defect.

Second Embodiment

An inspection substrate of a second embodiment is already shown in FIG. 3 to FIG. 5 for the first embodiment. Here, a configuration, a function and an effect, which are not described in the first embodiment and intrinsic to the second embodiment, are described.

A first feature of this inspection substrate is in that the dummy wiring 25a is provided by the same metal layer as that for the scan line 11 and the storage capacitor line 15 between the storage capacitor line 15 and the scan line 11 formed by extending a lower electrode using one of the two types of metals constituting the switching element 23, and that the dummy wiring 25a is connected to the signal line 13 through the contact hole 27b. Here, the lower electrode of the switching element 23 is the gate electrode.

With such a configuration, a short circuit between the scan line 11 present in the same layer as that for the dummy wiring 25a and the storage capacitor line 15 arrayed with the scan line 11 can be inspected through the dummy wiring 25a, and a spot of the short circuit can be specified. Specifically, when the short circuit occurs between the scan line 11 and the storage capacitor line 15, in the actual array substrate, in which portion of the wiring line the short circuit occurs cannot be determined though the short circuit can be detected simply as a line defect. As opposed to this, in this inspection substrate, the dummy wiring line 25a formed of the same metal layer as that for the scan line 11 and the storage capacitor line 15 is connected to the signal line 13, and accordingly, the short circuit between the scan line 11 and the storage capacitor line 15 becomes a cross short circuit through the dummy wiring line 25a and the signal line 13. Hence, the spot where the short circuit has occurred can be specified by measuring the voltage of the dummy wiring line 25a by means of the array tester.

A second feature of this inspection substrate is in that the signal line 13 formed by extending an upper electrode using one of the two types of metals constituting the switching element 23, and a dummy wiring line 34 formed by extending the storage capacitor upper electrode 17, are provided, and that the signal line 13, the dummy wiring line 34 and the storage capacitor upper electrode 17 are arranged adjacent to one another. Here, the upper electrode is the source electrode or the drain electrode.

A third feature of this inspection substrate is in that the signal line 13 formed by extending an upper electrode using one of the two types of metals constituting the switching element 23, the dummy wiring 34 formed by extending the storage capacitor upper electrode 17, and a dummy electrode 31, are provided, and that the signal line 13, the dummy wiring line 34, the dummy electrode 31 and the storage capacitor upper electrode 17 are arranged adjacent to one another.

In the second and third features, the dummy electrode 31 and the dummy wiring line 34 are provided, and arranged adjacent to the storage capacitor upper electrode 17. Thus, high-density wiring is formed, and the short circuit in the same layer is facilitated to occur. In such a way, the short circuit can be easily detected by means of the array tester, and in which portion or in which wiring line the failure relating to the short circuit is prone to occur can be anticipated based on the occurred failure relating to the short circuit.

A fourth feature of this inspection substrate is in that the dummy electrode 31 is electrically connected to the scan line 11 through the contact hole 27e. The dummy electrode 31 is connected to the scan line 11, and thus, by measuring the voltage of the dummy electrode 31 by means of the array tester, the short circuit between the scan line 11 and the storage capacitor line 15 in the same layer can be inspected, and the spot of the short circuit can be specified.

A fifth feature of this inspection substrate is in that sizes of the storage capacitor upper electrode 17 and the dummy electrode 31 electrically connected to the scan line 11 are set at predetermined sizes or more, and that a region with a predetermined width or more is provided in a part of the signal line 13. The sizes of the dummy electrode 31 and the storage capacitor upper electrode 17 are set at, for example, approximately 10 μm or more in terms of side lengths thereof. The above-described region is defined as, for example, a dummy electrode 33 with a width of approximately 10 μm or more. Here, the dummy electrode 31 is connected to the scan line 11 through the contact hole 27e.

With such a configuration, the dummy electrode 33, the storage capacitor upper electrode 17 and the dummy electrode 31 can be used as contact pads for receiving a probe of the array tester or the like. Specifically, the probe of the array tester is manually or automatically contacted with the dummy electrode 33, the storage capacitor upper electrode 17 and the dummy electrode 31, and electrical inspections between these and between these and others can be thus performed. In such a way, for example, characteristics of a single body of the TFT element constituting the switching element 23 can be measured.

Third Embodiment

Figure 6:
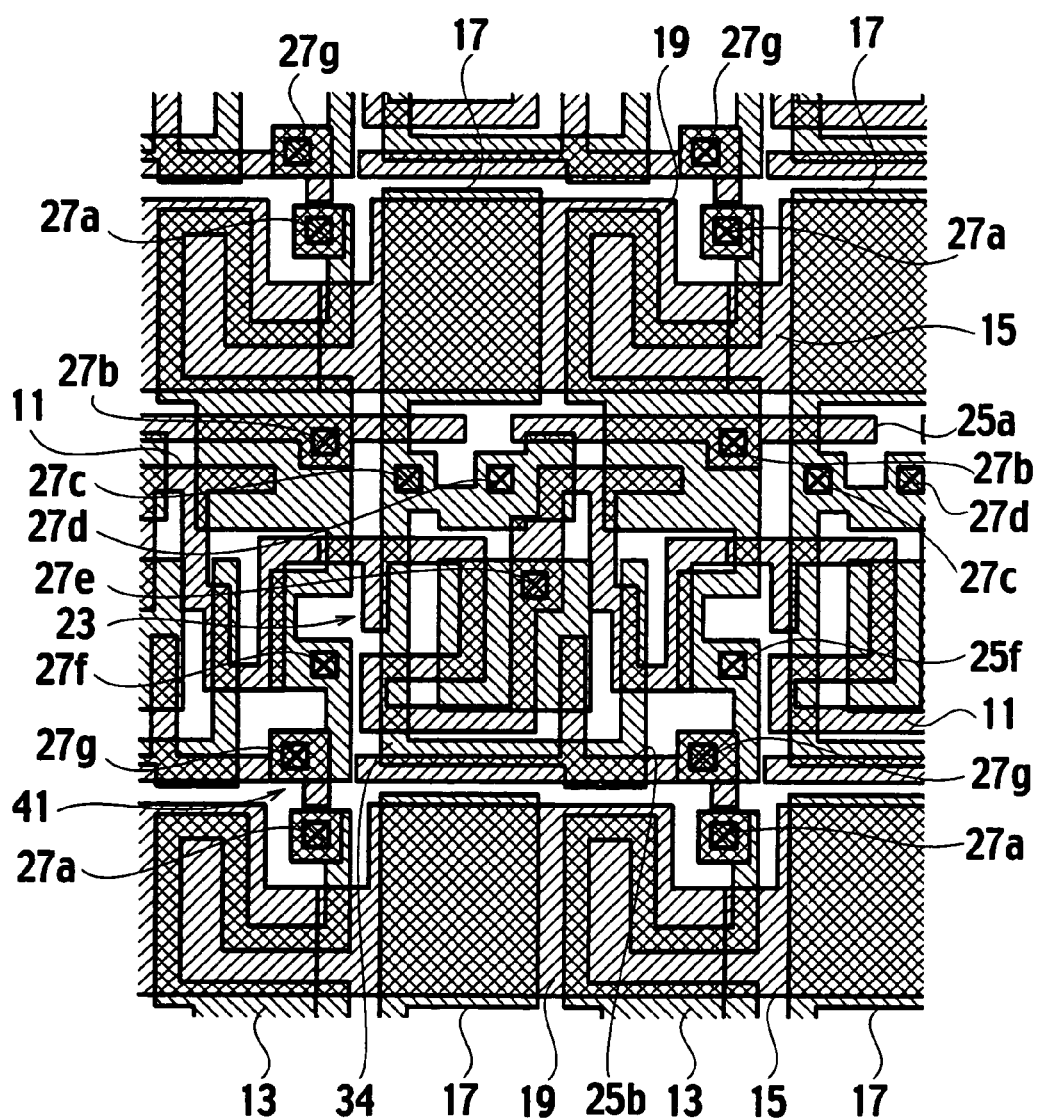
FIG. 6 shows a plan view of an inspection substrate for a display device in a third embodiment.

FIG. 6 shows a plan view of an inspection substrate in a third embodiment. A basic configuration of the inspection substrate of FIG. 6 is substantially similar to that described in the first embodiment with reference to FIG. 3 to FIG. 5. First and second features of the third embodiment are already shown in FIG. 3 to FIG. 5 as well as FIG. 6. A third feature of the third embodiment is shown in FIG. 6.

As shown by bold lines in FIG. 3 and FIG. 6, the first feature of this inspection substrate is in that the scan line 11 and the signal line 13 meander. More specifically, the scan line 11 meanders so as to detour around the regions of the wiring lines and the switching elements 23 in the same layer. The signal line 13 also meanders so as to detour around the regions of the wiring lines and the storage capacitor upper electrodes 17 in the same layer.

With such a configuration, wiring lengths of the scan line 11 and the signal line 13 are elongated, and the probability of occurrence of the break (open) of the scan line 11 and the signal line 13 is increased. In such a way, in which portion or in which wiring line the break failure is prone to occur can be anticipated based on the occurred failure relating to the open.

Note that, though both of the scan line 11 and the signal line 13 meander in FIG. 3 to FIG. 6, this inspection substrate is not limited to this, and at least one of the scan line 11 and the signal line 13 just has to meander.

The second feature of this inspection substrate is, in addition to the above description, in that the signal line 13 meanders on the storage capacitor line 15 as shown in FIG. 3 to FIG. 6.

In general, when the layer and the wiring line such as the storage capacitor line 15 are present under a wiring line, the wiring line concerned tends to be thinned more than when these layer and wiring line are not present. Accordingly, when the signal line 13 is placed on the storage capacitor line 15 as described above, the signal line 13 is thinned. In such a way, to which extent the signal line 13 is thinned, to which extent the signal line 13 is prone to be cut, and so on, can be confirmed. In addition, an extent to which the signal line 13 is thinned, which causes the break, can be confirmed.

As shown in FIG. 6, a third feature of this inspection substrate is, in addition to the above description, in that a contact chain structure 41 is provided. In the contact chain structure 41, at least one (signal line 13 in FIG. 6) of the signal line 13 and the scan line 11 is composed by alternately arranging the two types of metals constituting the electrodes of the switching element 23, and the respective ends of the signal line 13 and the scan line 11 are electrically connected to one another through the contact holes.

Figure 1:
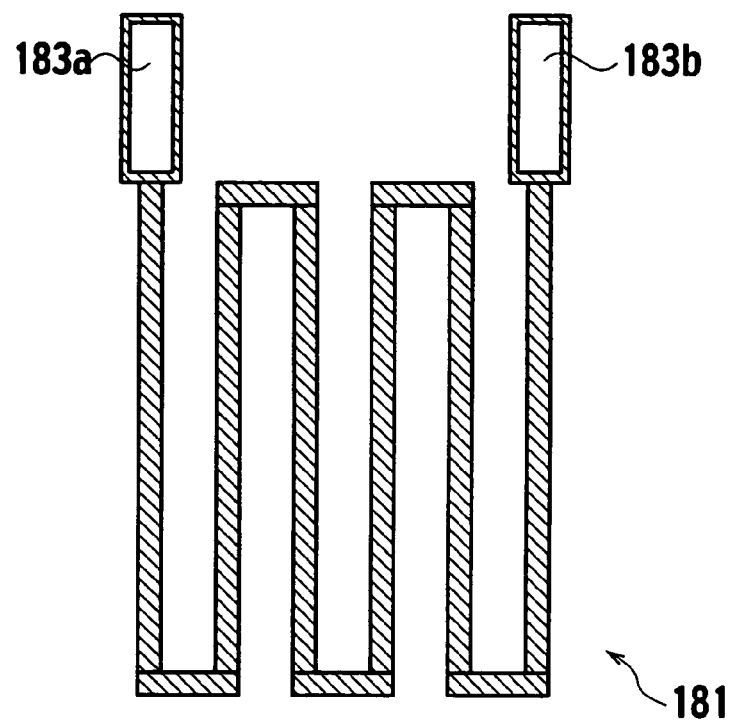
FIG. 1 shows a wring pattern in a PL chip.
Figure 2:
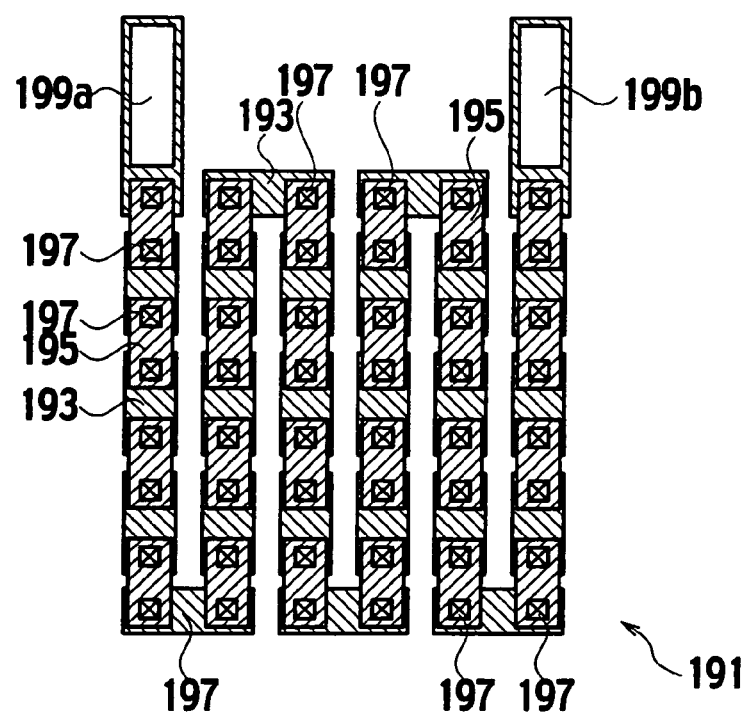
FIG. 2 shows a contact chain structure in the PL chip.

Specifically, as shown in an enlarged view of FIG. 7, the signal line 13 is composed by alternately arranging upper electrodes 23a of the switching element 23 and a lower electrode 23b thereof. Moreover, the respective ends of the upper electrodes 23a and the lower electrode 23b are electrically connected to one another through the contact hole 27a and the contact hole 27g. Here, each of the upper electrodes 23a is the source electrode or the drain electrode, and the lower electrode 23b is the gate electrode. When only the alternate arrangement of the two types of metals and the connected portions by the contact holes are shown, for example, a figure appears as shown in FIG. 2 though not accurate.

With the contact chain structure 41 as described above, a probability of occurrence of a defect of the contact hole is increased, and a break of the contact hole 27 can be easily detected by use of the array tester. Moreover, when abnormalities are not observed on an exterior appearance of the contact hole 27, in which portion the break has occurred can be specified based on a position of the corresponding signal line 13.

Note that, though only two upper electrodes 23a of the contact chain structure and one lower electrode 23b thereof are representatively shown in FIG. 7, in actual, the upper electrode 23a and the lower electrode 23b are provided for each of the plural signal lines 13. As a matter of course, the upper electrode 23a and the lower electrode 23b may be provided for each of the plural scan lines 11.

FIG. 8A shows a configuration of plural pads 51 for detecting a break, which are used for a common PL chip, and FIG. 8B shows an enlarged view of the pads 51. The plural pads 51 are connected to one another. The break between the pads can be detected by checking resistances between both ends of the plural pads 51 by means of a tester and the like.

Figure 9A:
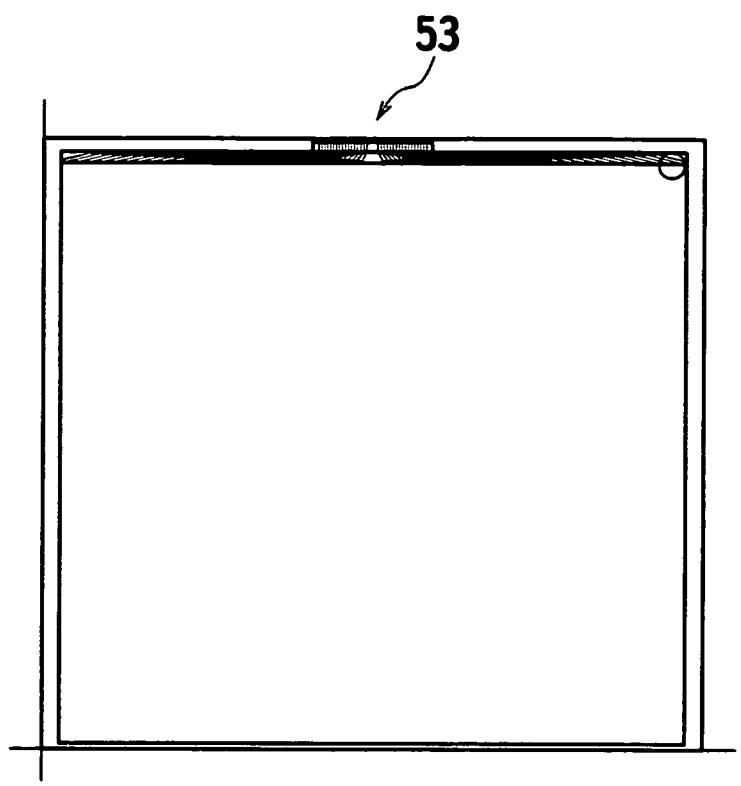
FIG. 9A shows a position of a pad for detecting a short circuit in the PL chip.
Figure 9B:
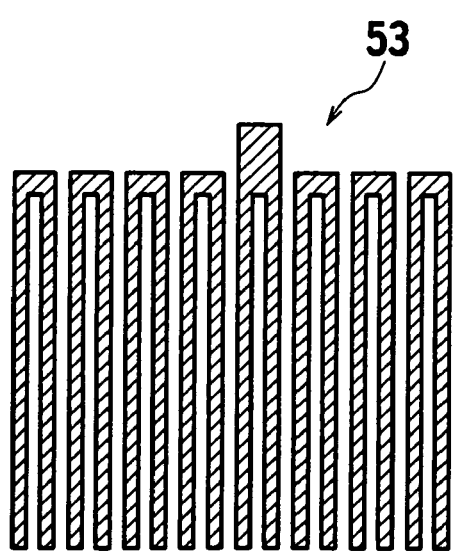
FIG. 9B shows an enlarged view of the pad.

FIG. 9A shows a configuration of plural pads 53 for detecting a short circuit, which are used for the common PL chip, and FIG. 8B shows an enlarged view of the pads 53. The plural pads 53 are separated from one another. The short circuit between the respective pads can be detected by checking conductions between the plural pads 53 by means of the tester and the like.

Note that, in the respective embodiments described above, the inspection substrate for the active matrix type liquid crystal display device using the polysilicon layer of the P-channel type as a semiconductor layer has been described, and however, the present invention is not limited to this, and a polysilicon layer of an N-channel type may also be used. Moreover, a similar effect can be obtained even in the case of using, as the semiconductor layer, other semiconductor layers such as, for example, an amorphous silicon layer.

Fourth Embodiment

In a substantially similar way to the array substrate for use in the active matrix type liquid crystal display device, an inspection substrate in this embodiment includes scan lines, signal lines, storage capacitor lines, storage capacitor elements, switching elements, and the like, and is formed by using the same manufacturing process as the actual manufacturing process. The inspection substrate simulates the actual array substrate by forming special wiring lines for the inspection thereon, making contrivance for the inspection thereon, and so on. The inspection substrate is inspected by means of the array tester, thus making it possible to estimate the defects of the respective wiring lines, the failure spots and the like in the manufacturing line.

Figure 10:
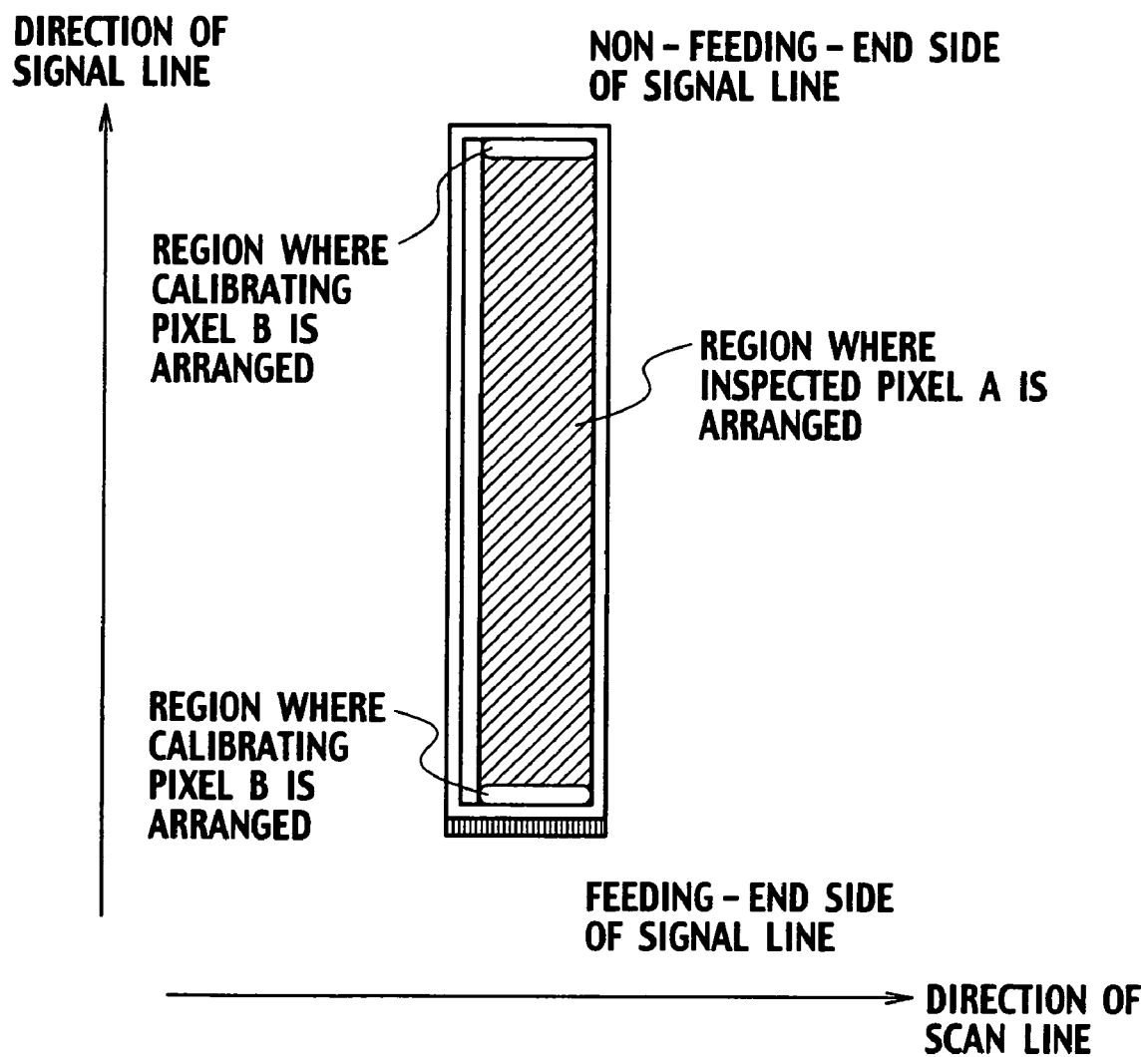
FIG. 10 is a plan view showing an outline of a chip in an active matrix type inspection substrate according to a fourth embodiment.

FIG. 10 is a plan view showing an outline of a chip in this inspection substrate. In this chip, an inspected pixel A is arranged on each intersection point of plural scan lines and plural signal lines, which are arranged to intersect each other, and calibrating pixels B are arranged on a feeding-end side and non-feeding-end side of each signal line.

Figure 11:
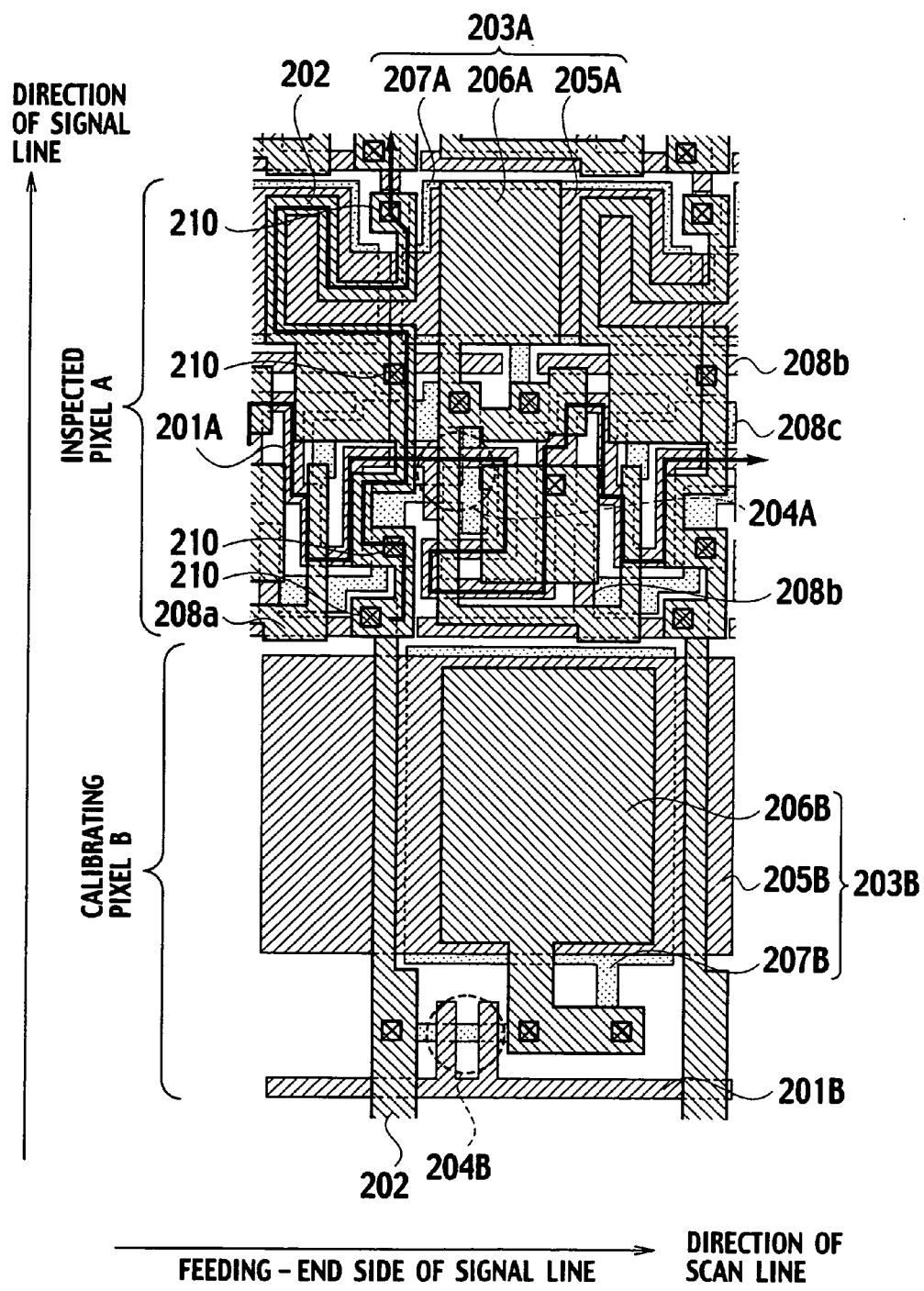
FIG. 11 is an enlarged view of an inspected pixel and a calibrating pixel, which are arranged along a direction of a signal line on a feeding-end side in the active matrix type inspection substrate according to the fourth embodiment.

FIG. 11 is an enlarged view of the inspected pixel A and the calibrating pixel B, which are arranged along the direction of the signal line on the feeding-end side in the inspection substrate of FIG. 10. FIG. 11 shows the inspected pixel A including a storage capacitor element 203A and a switching element 204A electrically connected to the storage capacitor element 203A, the inspected pixel A being arranged on an intersection point of a scan line 201A and a signal line 202, which are wired to intersect each other. Moreover, FIG. 11 shows the calibrating pixel B including a storage capacitor element 203B having a larger storage capacity than a storage capacity of the storage capacitor element 203A of the inspected pixel A.

In the inspected pixel A, the storage capacitor element 203A includes a storage capacitor line 205A, an upper electrode 206A arranged on the storage capacitor line 205A, and a lower electrode 207A located thereunder. The storage capacitor line 205A is provided in the direction of the scan line, and wired to intersect the signal line 202 within a pitch for one pixel. Moreover, in the vicinity of the intersection point of the scan line 201A and the signal line 202, the switching element 204A is arranged, and electrically connected to the upper electrode 206A and the lower electrode 207A. For the switching element 204A, for example, a thin-film transistor (hereinafter, referred to as a TFT element) of a P-channel type is used.

Here, a configuration for facilitating the detection of a defect of each wiring line, a shape defect of the contact hole, a failure spot, and the like in the active matrix type inspection substrate is described by use of the inspected pixel A of FIG. 11. In the inspected pixel A of FIG. 11, in a region other than the scan line 201A, the signal line 202, the storage capacitor line 205A, the upper electrode 206A, the lower electrode 207A and the switching element 204A, an uppermost-layer dummy wiring line 208a, an intermediate-layer dummy wiring line 208b and a lowermost-layer dummy wiring line 208c (hereinafter, generically referred to as a "dummy wiring line 208"), which are electrically connected to any of the scan line 201A, the signal line 202, the storage capacitor line 205A, the upper electrode 206A, the lower electrode 207A and the switching element 204A, are wired. By wiring the wiring lines with high density in such a way, the probability of occurrence of the short-circuit defect between the wiring lines can be increased.

Moreover, the scan line 201A and the signal line 202 are wired while meandering. Wiring lengths of the scan line 201A and the signal line 202 are elongated in such a way, thus making it possible to increase the probability of occurrence of the break defect of each of the wiring lines. Furthermore, a configuration is adopted, in which contact holes 210 are provided in the signal line 202, and the respective wiring lines are interconnected through the contact holes 210, thus making it possible to increase the probability of occurrence of the break defect owing to a shape defect of the contact holes 210. In such a way, the defect of each wiring line, the shape defect of each contact hole and the failure spot in the active matrix type inspection substrate can be detected easily.

Next, the calibrating pixel B arranged in order to correct the influence from the variations in sensitivity for the input signals of the respective inspection pins of the array tester on the array tester side is described by use of FIG. 11. In the calibrating pixel B of FIG. 11, the storage capacitor element 203B includes a storage capacitor line 205B, an upper electrode 206B arranged on the storage capacitor line, and a lower electrode 207B located thereunder. The storage capacitor line 205B is provided in the direction of the scan line, and wired to intersect the signal line 202 within the pitch for one pixel. Moreover, in the vicinity of the intersection point of a scan line 201B and the signal line 202, a switching element 204B is arranged, and electrically connected to the upper electrode 206B and the lower electrode 207B. For the switching element 204B, for example, a thin-film transistor of the P-channel type is used. A difference of the calibrating pixel B from the inspected pixel A is as follows. Specifically, the dummy wiring line 208 for inspecting the defect is deleted, and an area of the storage capacitor line 205B, the upper electrode 206B and the lower electrode 207B which constitute the storage capacitor element 203B is set to double that of the corresponding ones of the inspected pixel A, and thus a storage capacity of the storage capacitor element 203B is set approximately to double that of the storage capacitor element 203A of the inspected pixel A.

As described above, the calibrating pixels B are arranged on the feeding end and non-feeding end of the signal line, and the storage capacity of the calibrating pixel B is made larger than the storage capacity of the inspected pixel A, thus making it possible to enhance detection sensitivity when the array tester detects the charge stored in the storage capacitor. In such a way, the array tester compares the inspection data of the calibrating pixels B between the signal lines, thus making it possible to obtain the data for correcting the output result of the array tester, which is affected by the variations in sensitivity for the input signals of the respective inspection pins of the array tester.

Figure 12:
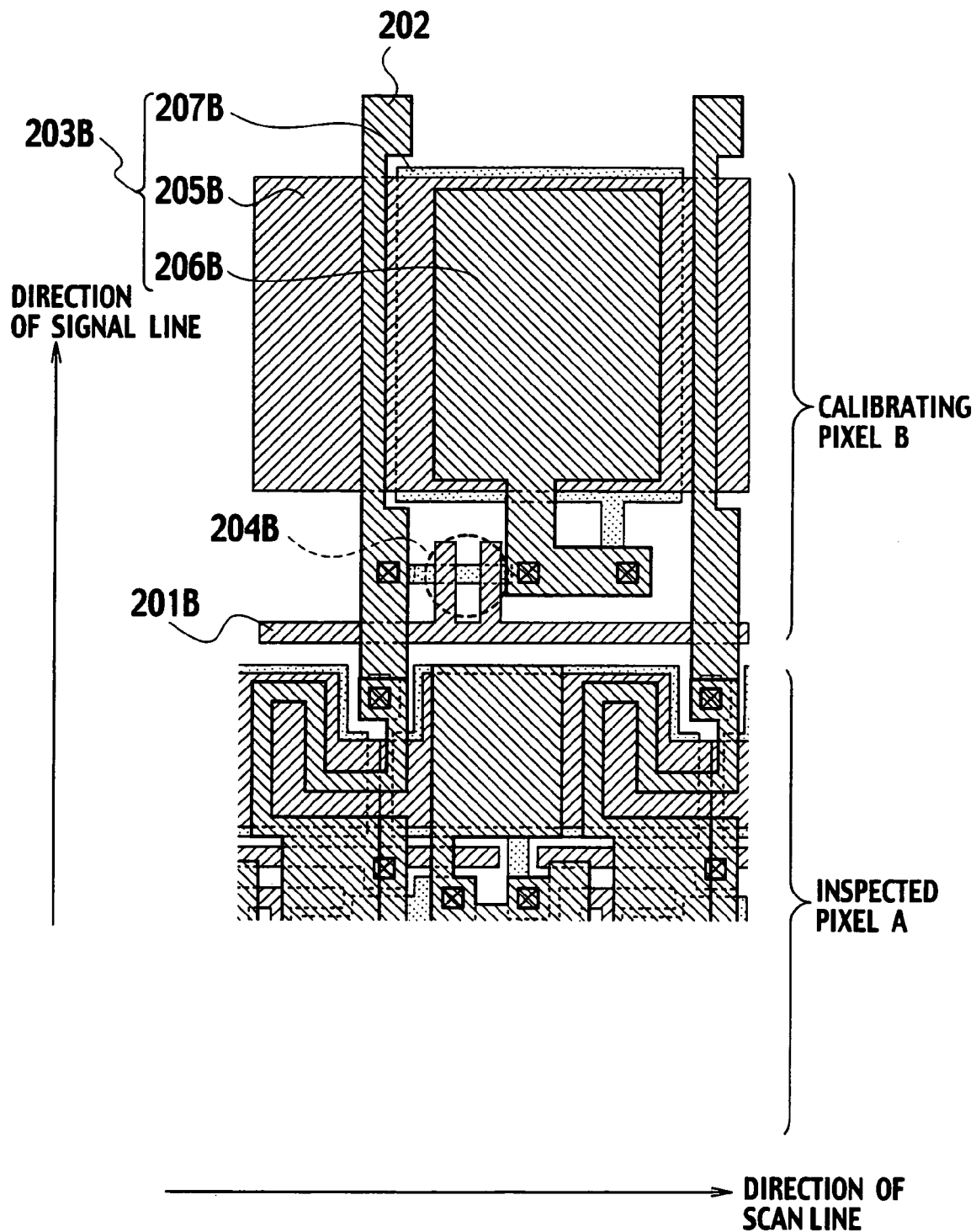
FIG. 12 is an enlarged view of the inspected pixel and a calibrating pixel, which are arranged along the direction of the signal line on a non-feeding-end side within the one chip of the active matrix type inspection substrate according to the fourth embodiment.

Next, the calibrating pixel B arranged in order to correct the influence of the parasitic capacitance in the direction of the signal line on the array tester side is described by use of FIGS. 11 and 12. FIG. 12 is an enlarged view of the inspected pixel A and the calibrating pixel B, which are arranged along the direction of the signal line on the non-feeding-end side within one chip of the inspection substrate of FIG. 10. The calibrating pixel B arranged on the feeding-end side of the signal line 202 shown in FIG. 11 and the calibrating pixel B arranged on the non-feeding-end side of FIG. 12 have the same configuration, and the calibrating pixels B are arranged on the feeding end and non-feeding end of the same signal line 2 so as to be opposite to each other.

As shown in FIGS. 11 and 12, the calibrating pixels B having the same configuration are arranged on the feeding end and non-feeding end of the signal line 202. Thus, the array tester compares the inspection data of the two calibrating pixels B having the same configuration in the same signal line with each other, thus making it possible to obtain the data for correcting the output result of the inspected pixel A, which is affected by the parasitic capacitance in the direction of the signal line.

In this embodiment, the calibrating pixels B are arranged on the feeding end and non-feeding end of each signal line, and the storage capacity in each calibrating pixel B is made larger than the storage capacity of the inspected pixel A. Hence, the detection sensitivity when the array tester detects the charge stored in the storage capacitor can be enhanced. In such a way, the array tester compares the inspection data of the calibrating pixels B between the signal lines, thus making it possible to obtain the data for correcting the output result of the array tester, which is affected by the variations in sensitivity for the input signals of the respective inspection pins of the array tester. Furthermore, the inspection data of two calibrating pixels B having the same configuration in the same signal line is compared with each other, thus making it possible to obtain the data for correcting the influence of the parasitic capacitance in the direction of the signal line.

Specifically, this inspection substrate can supply, to the array tester, the inspection data for correcting the detection result of the array tester, which is affected by the parasitic capacitance of the signal line and the variations in sensitivity for the input signals of the respective inspection pins of the array tester.

Fifth Embodiment

Figure 13:
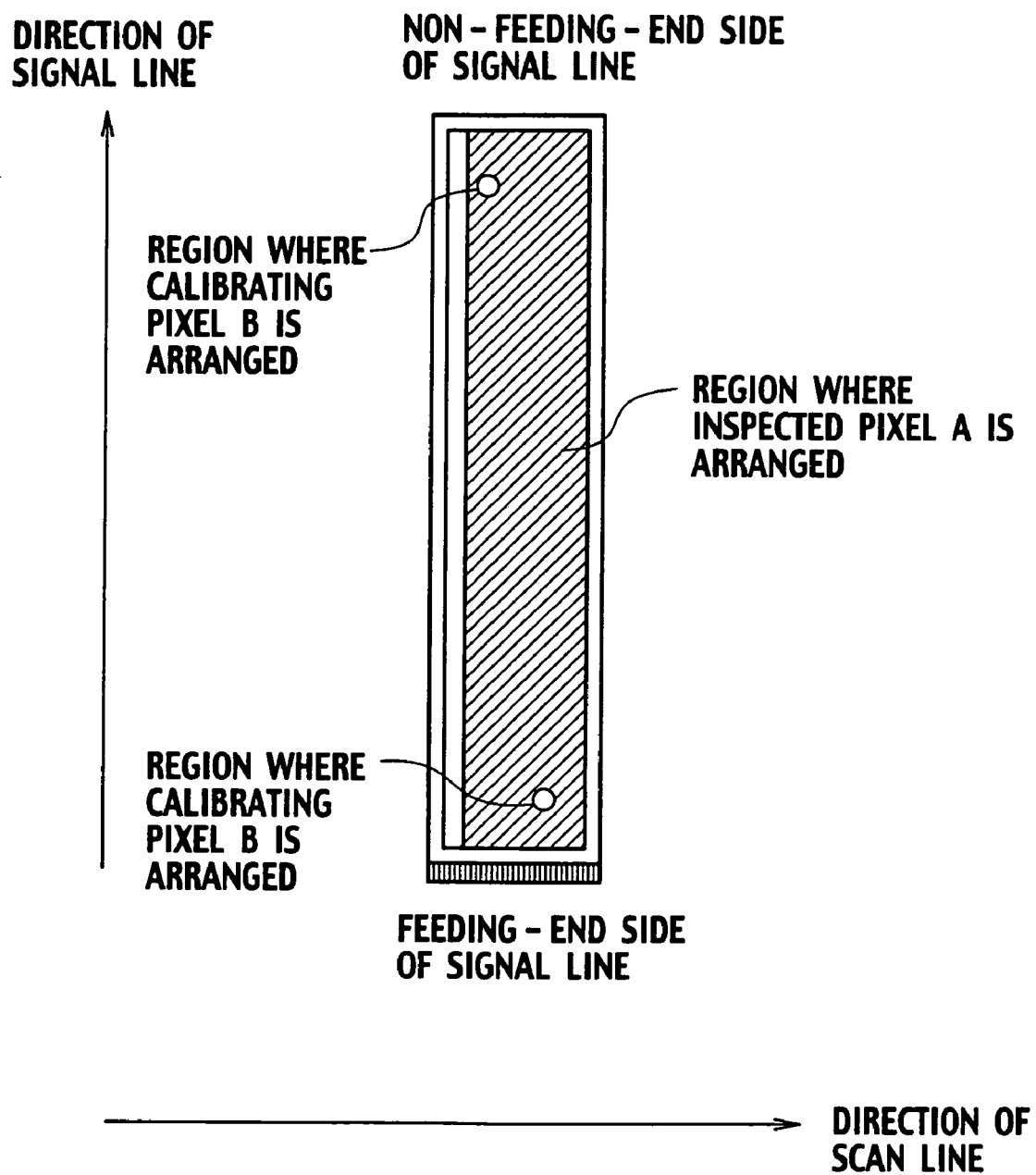
FIG. 13 is a plan view showing an outline of a chip in an active matrix type inspection substrate according to a fifth embodiment.

FIG. 13 is a plan view showing an outline of a chip in an inspection substrate in this embodiment. In this chip, an inspected pixel A is arranged on each intersection point of plural scan lines and plural signal lines, which are arranged to intersect each other, and calibrating pixels B including switching elements different in characteristics from that of the inspected pixel A are arranged on two spots within the one chip. Note that, here, as described by use of FIG. 11 in the fourth embodiment, not only for the inspected pixel A but also for the calibrating pixels B, in order to facilitate the detection of the defect of each wiring line, the shape defect of the contact holes, the failure spot and the like, dummy wiring lines are provided, the scan lines and the signal lines are made as meandering wiring lines, and contact holes are provided in the signal line to interconnect the respective wiring lines through the contact holes.

Figure 14:
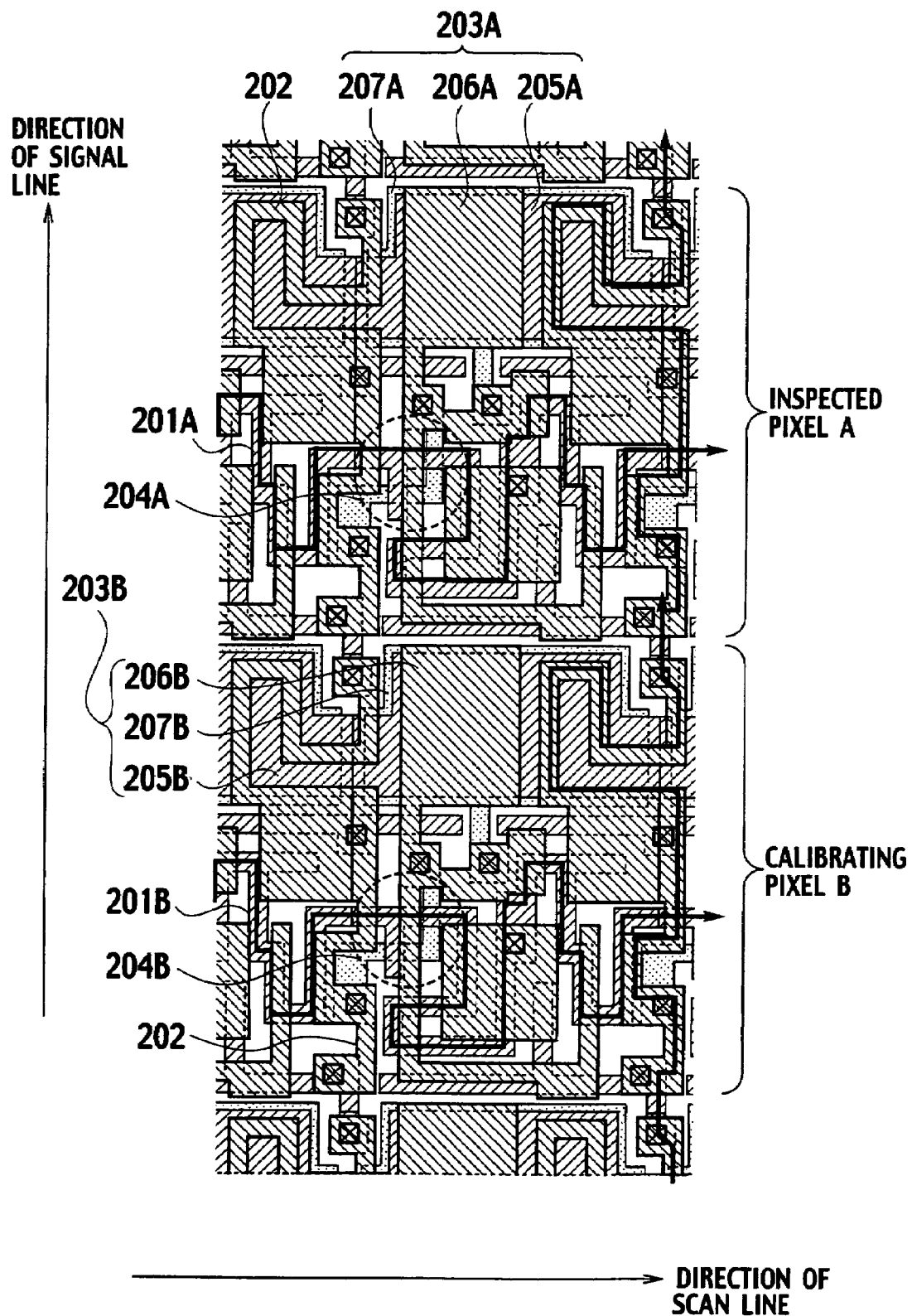
FIG. 14 is an enlarged view of a calibrating pixel arranged along a direction of a signal line and an inspected pixel in the vicinity thereof within the one chip of the active matrix type inspection substrate according to the fifth embodiment.

FIG. 14 is an enlarged view of the calibrating pixel B arranged along the direction of the signal line of FIG. 13 and the inspected pixel A in the vicinity thereof FIG. 14 shows the inspected pixel A including the storage capacitor element 203A and the switching element 204A electrically connected to the storage capacitor element 203A, the inspected pixel A being arranged on the intersection point of the scan line 201A and the signal line 202, which are arranged to intersect each other. Moreover, FIG. 14 shows the calibrating pixel B including the switching element 204B different in characteristics from the switching element 204A.

In the inspected pixel A, the storage capacitor element 203A includes the storage capacitor line 205A, the upper electrode 206A arranged on the storage capacitor line, and the lower electrode 207A located thereunder. The storage capacitor line 205A is provided in the direction of the scan line, and wired to intersect the signal line 202 within the pitch for one pixel. The switching element 204A arranged in the vicinity of the intersection point of the scan line 201A and the signal line 202 is electrically connected to the upper electrode 206A and the lower electrode 207A.

Figure 15:
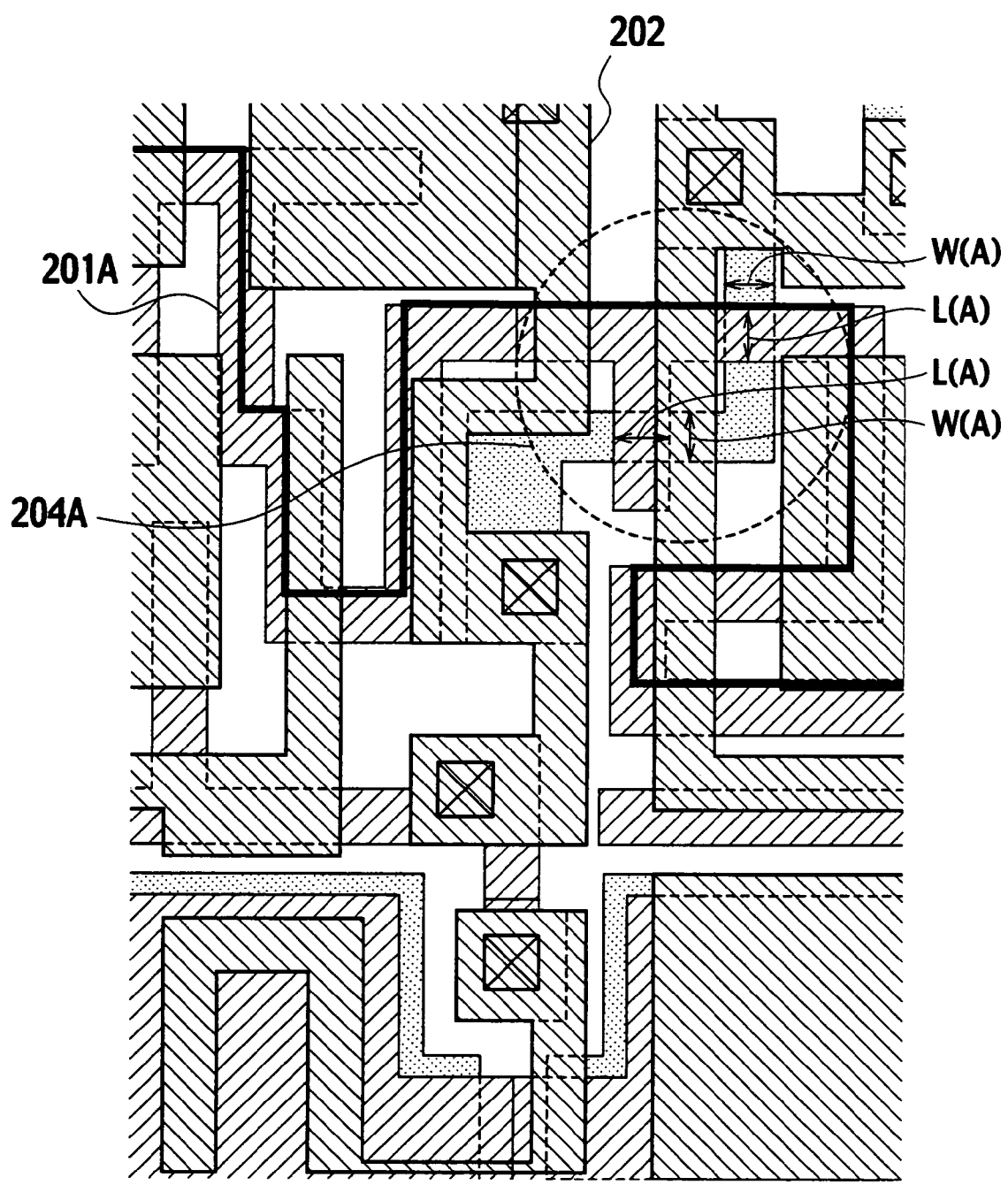
FIG. 15 is an enlarged view of a switching element of the inspected pixel in the active matrix type inspection substrate according to the fifth embodiment.

FIG. 15 is an enlarged view of the switching element 204A of the inspected pixel A shown in FIG. 14. In FIG. 15, a P-channel type TFT is arranged as the switching element 204A. Channel width W(A) of this TFT is 4 μm, and channel length L(A) thereof is 5 μm. Here, in order to reduce a leak current when the TFT is switched off, two TFTs of the same size are arranged in series.

Figure 16:
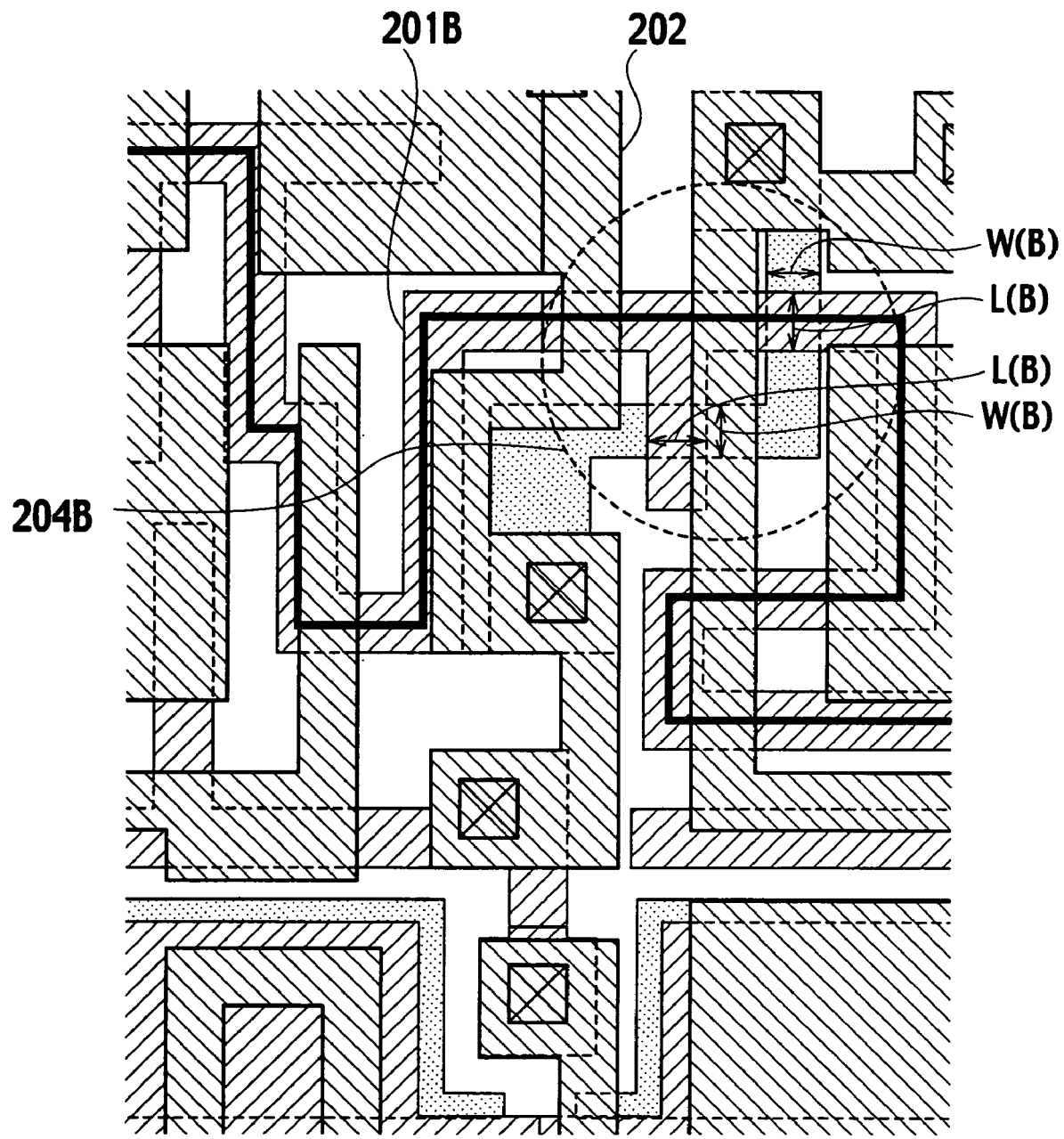
FIG. 16 is an enlarged view of a switching element of the calibrating pixel in the active matrix type inspection substrate according to the fifth embodiment.

Next, the calibrating pixel B arranged in order to determine abnormalities of the channel length L(A) of the switching element 204A owned by the inspected pixel A is described by use of FIGS. 14 and 16. In the calibrating pixel B of FIG. 14, the storage capacitor element 203B includes the storage capacitor 205B, the upper electrode 206B arranged on the storage capacitor line, and the lower electrode 207B located thereunder. The storage capacitor line 205B is provided in the direction of the scan line, and wired to intersect the signal line 202 within the pitch for one pixel. The switching element 204B arranged in the vicinity of the intersection point of the scan line 201B and the signal line 202 is electrically connected to the upper electrode 206B and the lower electrode 207B.

FIG. 16 is an enlarged view of the switching element 204B of the calibrating pixel B shown in FIG. 14. In FIG. 16, a P-channel type TFT is arranged as the switching element 204B. Channel width W(B) of the TFT is 4 μm, and channel length L(B) thereof is 3 μm. Also here, in order to reduce the leak current when the TFT is switched off, two TFTs of the same size are arranged in series. As described above, the calibrating pixel B is configured similarly to the inspected pixel A except that the channel length L(B) of the switching element 204B is made shorter than the channel length L(A) of the switching element 204A.

In such a way, the calibrating pixel B has electrical characteristics of the switching element 204B, which are different from the electrical characteristics of the switching element 204A of the inspected pixel A. Accordingly, as a result of comparing the inspection data of the calibrating pixel B in which the channel length L(B) is shortened in advance and the detection result of the inspected pixel A located in the vicinity of the calibrating pixel B with each other in the array tester, if the inspection data and the detection result exhibit similar electrical characteristics, then it can be determined that the inspected pixel A is abnormal in characteristics and that the switching element 204A is abnormal in channel length.

Here, the calibrating pixel B including the switching element 204B having the different channel length L(B) is used. However, even in the case of using the calibrating pixel B including the switching element 204B in which at least one of the channel width W(B) and the channel length L(B) is different, the array tester can detect the abnormalities of the inspected pixel A located in the vicinity of the calibrating pixel B in a similar manner. Here, the reason that the inspected pixel A located in the vicinity of the calibrating pixel B is set as one to be compared therewith is because, in the inspected pixel A concerned, the influence from the parasitic capacitance of the signal line or the variations in sensitivity for the input signals of the respective inspection pins of the array tester during the inspection is relatively small.

Meanwhile, for example, in the case of correcting, according to the configuration described in the fourth embodiment, the detection result of the array tester, which is affected by the parasitic capacitance of the signal line and the variations in sensitivity for the input signals of the respective inspection pins of the array tester, it is not always necessary that the inspected pixel A be located in the vicinity of the calibrating pixel B. In this case, based on the inspection data of one calibrating pixel B, the array tester can determine the abnormalities of the respective inspected pixels A with regard to the detection results of all the inspected pixels A within the same chip.

Hence, according to this embodiment, the calibrating pixel B including the switching element having the different characteristics to those of the inspected pixel A is provided. Thus, as a result of comparing the inspection data of the calibrating pixel B and the detection result in the inspected pixel A with each other, if the inspection data and the detection result exhibit similar electrical characteristics, then the array tester can determine that the inspected pixel A includes the switching element 204A abnormal in characteristics.

Specifically, the inspection substrate of this embodiment can supply, to the array tester, the inspection data for detecting the inspected pixel A including the switching element 204A abnormal in characteristics irrespective of the influence from the parasitic capacitance of the signal line and the variations in sensitivity for the input signals of the respective inspection pins of the array tester.

Note that, though the configuration in which the calibrating pixels B are arranged in two spots within one chip in the inspection substrate has been described in this embodiment, the configuration is not limited to this. For example, even if the calibrating pixels B are arranged on more than two spots within one chip in the inspection substrate, and even if the calibrating pixels B are arranged at arbitrary positions for each of plural signal lines, the array tester can determine the abnormalities of the inspected pixel A by comparing the inspection data of the calibrating pixel B and the detection result of the inspected pixel A in the vicinity of the calibrating pixel B with each other.

Moreover, in the inspection substrate, an inspected pixel chip including only the inspected pixels A is arranged. Furthermore, in the inspection substrate, a calibrating pixel chip of the same size as the inspected pixel chip, in which one chip is entirely set as the calibrating pixel B in an arbitrary region of the inspection substrate, is arranged. Thus, the array tester can determine abnormalities of all the inspected pixels A in the inspected pixel chip by comparing detection results obtained from the inspected pixel chips and inspection data obtained from the calibrating pixel chips between pixels corresponding to each other.

Sixth Embodiment

FIG. 17 is an enlarged view of the inspection pixel A and the calibrating pixel B, which are arranged along the direction of the scan line within one chip of an inspection substrate in this embodiment. Note that, here, as described by use of FIG. 11 in the fourth embodiment, for the inspected pixel A and the calibrating pixels B, in order to facilitate the detection of the defect of each wiring line, the shape defect of the contact holes, the failure spot and the like, dummy wiring lines are provided, the scan lines and the signal lines are made as meandering wiring lines, and contact holes are provided in the signal line to interconnect the respective wiring lines through the contact holes.

FIG. 17 shows the inspected pixel A including the storage capacitor element 203A in which a storage capacitor line 205 is wired between the upper electrode 206A and the lower electrode 207A, and including the switching element 204A electrically connected to the storage capacitor element 203A, the inspected pixel A being arranged on the intersection point of a scan line 201 and a signal line 202A, which are arranged to intersect each other. Moreover, FIG. 14 shows the calibrating pixel B in a part of which a short-circuit defect 209 is prepared in advance.

In the inspected pixel A, the storage capacitor element 203A includes the storage capacitor line 205, the upper electrode 206A arranged on the storage capacitor line, and the lower electrode 207A located thereunder. The storage capacitor line 205 is provided in the direction of the scan line, and wired to intersect the signal line 202A within the pitch for one pixel.

Next, the calibrating pixel B arranged in order to detect the inspected pixel A having the short-circuit defect is described. In the calibrating pixel B of FIG. 17, the storage capacitor element 203B includes the storage capacitor line 205, the upper electrode 206B arranged on the storage capacitor line, and the lower electrode 207B located thereunder. The storage capacitor line 205 is provided in the direction of the scan line, wired to intersect a signal line 202B within the pitch for one pixel. Moreover, the storage capacitor line 205 includes the short-circuit defect 209 in which the signal line 202B and the upper electrode 206B in the same layer are short-circuited.

As described above, the calibrating pixel B includes the short-circuit defect 209, and accordingly, has electrical characteristics different from the electrical characteristics of the inspected pixel A. Therefore, as a result of comparing the inspection data of the calibrating pixel B including the short-circuit defect 209 and the detection result of the inspected pixel A located in the vicinity of the calibrating pixel B with each other, if characteristics of both are substantially equal to each other, then the array tester can determine that the inspected pixel A concerned has the short-circuit defect.

Here, the reason that the inspected pixel A located in the vicinity of the calibrating pixel B is set as one to be compared therewith is because, in the inspected pixel A concerned, the influence from the parasitic capacitance of the signal line or the variations in sensitivity for the input signals of the respective inspection pins of the array tester during the inspection is relatively small.

Meanwhile, for example, in the case of correcting, according to the configuration described in the fourth embodiment, the detection result of the array tester, which is affected by the parasitic capacitance of the signal line and the variations in sensitivity for the input signals of the respective inspection pins of the array tester, it is not always necessary that the inspected pixel A be located in the vicinity of the calibrating pixel B. In this case, based on the inspection data of one calibrating pixel B, the array tester can determine whether or not each inspected pixel A has the short-circuit defect with regard to the detection results of all the inspected pixels A within the same chip.

Hence, according to this embodiment, the calibrating pixel B including the short-circuit defect 209 is provided, and thus the calibrating pixel B has the electrical characteristics different from the electrical characteristics of the inspected pixel A. Accordingly, as a result of comparing the inspection data of the calibrating pixel B including the short-circuit defect 209 and the detection result of the inspected pixel A with each other, if the characteristics of both are substantially equal to each other, then the array tester can determine that the inspected pixel A concerned has the short-circuit defect.

Specifically, the active matrix type inspection substrate can supply, to the array tester, the inspection data for enabling the sure detection of the short-circuit defect irrespective of the influence from the parasitic capacitance of the signal line and the variations in sensitivity for the input signals of the respective inspection pins of the array tester.

Note that, though the short circuit owned by the calibrating pixel in this embodiment has been described by taking, as an example, the case where the signal line and the upper electrode are short-circuited, the short circuit is not limited to this case. If portions to be compared with each other are portions between which a potential difference may occur in the actual operation of the switching element of the pixel, the portions are connected to each other, short-circuited, and formed into the calibrating pixel in advance, and inspection data of the calibrating pixel including the short-circuit defect and the detection result of the inspected pixel are compared with each other, thus making it possible to determine the inspected pixel including the short-circuit defect. For example, it is desirable that at least two of the scan line, the signal line, the storage capacitor line, and the upper electrode be short-circuited.

Moreover, though the defect owned by the calibrating pixel in this embodiment has been described by taking, as an example, the case where the defect is the short-circuit defect, the defect is not limited to this case. A wiring line constituting the pixel is broken to be formed into the calibrating pixel in advance, and inspection data of the calibrating pixel including the breaking defect and the detection result of the inspected pixel are compared with each other, thus making it possible to specify the inspected pixel including the breaking defect. For example, it is desirable that, with regard to the breaking defect, at least one of the scan line and the storage capacitor line be broken.

Moreover, though each of the above-described respective embodiments has been described by taking, as an example, the active matrix type liquid crystal display device using the polysilicon layer of the P-channel type as the semiconductor layer, the semiconductor layer and the liquid crystal display device are not limited to this. For example, similar effects can be obtained also in the case of using a polysilicon layer of an N-channel type and in an active matrix type liquid crystal display device using another semiconductor layer such as a polysilicon layer.

What is claimed is:

1. An inspection substrate for a display device, comprising:
   plural scan lines and plural signal lines, which are arranged to intersect each other;
   plural storage capacitor lines arrayed with the scan lines;
   storage capacitor elements, each of which uses a part of the storage capacitor line as one of electrodes thereof;
   storage capacitor upper electrodes formed of the same layer as a layer for the signal lines and electrically connected to the storage capacitor elements;
   switching elements arranged on intersection points of the signal lines and the scan lines and electrically connected to the storage capacitor elements; and
   dummy wiring lines formed by use of at least one of two types of metals constituting electrodes of the switching elements, and electrically connected to any of the storage capacitor lines, the signal lines and the storage capacitor upper electrodes; and
   dummy electrodes arranged corresponding to each of the switching elements, electrically connected to the scan lines, and configured to be used as contact pads for receiving a probe of a tester.

2. The inspection substrate for a display device according to claim 1,
   wherein a wired region formed of the signal lines, the scan lines, the storage capacitor lines, the storage capacitor upper electrodes, the switching elements, and the dummy wiring lines, is larger than a non-wired region where any of the wiring lines does not exist.

3. The inspection substrate for a display device according to claim 1,
   wherein the dummy wiring lines formed of the same metal layer as a layer for the scan lines and the storage capacitor lines are arranged between the storage capacitor lines and scan lines formed by extending lower electrodes using one of the two types of metals constituting the switching elements.

4. The inspection substrate for a display device according to claim 3,
   wherein the dummy wiring lines are electrically connected to the signal lines.

5. The inspection substrate for a display device according to claim 3, further comprising:
   signal lines formed by extending upper electrodes using one of the two types of metals constituting the switching elements; and
   dummy wirings formed by extending the storage capacitor upper electrodes,
   wherein the signal lines, the dummy wiring lines and the storage capacitor upper electrodes are arranged adjacent to one another.

6. The inspection substrate for a display device according to claim 3, further comprising:
   signal lines formed by extending upper electrodes of the switching elements; and
   dummy wiring lines formed by extending the storage capacitor upper electrodes;
   wherein the signal lines, the dummy wiring lines, the dummy electrodes and the storage capacitor upper electrodes are arranged adjacent to one another.

* * * * *